US012685126B2

(12) United States Patent
Lee et al.

(10) Patent No.: US 12,685,126 B2
(45) Date of Patent: Jul. 14, 2026

(54) INTERCONNECT STRUCTURE

(71) Applicant: Taiwan Semiconductor Manufacturing Company, Ltd., Hsinchu (TW)

(72) Inventors: Shao-Kuan Lee, Kaohsiung City (TW); Hsin-Yen Huang, New Taipei City (TW); Cheng-Chin Lee, Taipei City (TW); Kuang-Wei Yang, Hsinchu (TW); Ting-Ya Lo, Hsinchu (TW); Chi-Lin Teng, Taichung City (TW); Hsiao-Kang Chang, Hsinchu City (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 890 days.

(21) Appl. No.: 17/873,214

(22) Filed: Jul. 26, 2022

(65) Prior Publication Data

US 2022/0359385 A1    Nov. 10, 2022

Related U.S. Application Data

(62) Division of application No. 17/097,505, filed on Nov. 13, 2020, now Pat. No. 11,538,749.

(51) Int. Cl.
| | |
|---|---|
| *H10W 20/42* | (2026.01) |
| *H10W 20/00* | (2026.01) |
| *H10W 20/48* | (2026.01) |

(52) U.S. Cl.
CPC ......... *H10W 20/42* (2026.01); *H10W 20/089* (2026.01); *H10W 20/48* (2026.01)

(58) Field of Classification Search
CPC ......... H01L 23/53238; H01L 23/53295; H01L 23/5226; H01L 23/5329; H01L 21/76807;
(Continued)

(56) References Cited

U.S. PATENT DOCUMENTS

| | | | |
|---|---|---|---|
| 2006/0121739 A1* | 6/2006 | Farber | H01L 21/76816 257/E21.252 |
| 2016/0027738 A1 | 1/2016 | Murray et al. | |
(Continued)

OTHER PUBLICATIONS

Notice of Allowance dated Aug. 15, 2022 for U.S. Appl. No. 17/097,505.
(Continued)

*Primary Examiner* — John M Parker
(74) *Attorney, Agent, or Firm* — Eschweiler & Potashnik, LLC

(57) ABSTRACT

The present disclosure, in some embodiments, relates to an integrated chip. The integrated chip includes a first interconnect and a second interconnect disposed within a first inter-level dielectric (ILD) layer over a substrate. A lower etch stop structure is disposed on the first ILD layer and a third interconnect is disposed within a second ILD layer that is over the first ILD layer. The third interconnect extends through the lower etch stop structure to contact the first interconnect. An interconnect patterning layer is disposed on the second interconnect and laterally adjacent to the lower etch stop structure.

20 Claims, 16 Drawing Sheets

(58) Field of Classification Search
CPC ......... H01L 21/76834; H01L 21/76849; H01L
21/76808; H01L 21/76843; H01L
21/76831; H01L 21/76816; H10W
20/435; H10W 20/42; H10W 20/48;
H10W 20/089
See application file for complete search history.

(56) References Cited

U.S. PATENT DOCUMENTS

| | | | |
|---|---|---|---|
| 2016/0027896 A1* | 1/2016 | Lee ................... | H01L 21/76816 |
| | | | 438/653 |
| 2017/0005000 A1 | 1/2017 | Beyne | |
| 2017/0217831 A1* | 8/2017 | Hart ................... | C03C 17/2453 |
| 2018/0033727 A1 | 2/2018 | Lee et al. | |
| 2018/0166333 A1 | 6/2018 | Yang et al. | |
| 2019/0244896 A1 | 8/2019 | Lee et al. | |
| 2021/0005548 A1 | 1/2021 | Lee et al. | |
| 2021/0082805 A1* | 3/2021 | Haran ............... | H01L 21/76877 |
| 2021/0082829 A1 | 3/2021 | Yang et al. | |
| 2021/0082832 A1 | 3/2021 | Yang et al. | |
| 2021/0398898 A1 | 12/2021 | Yang et al. | |

OTHER PUBLICATIONS

Non-Final Office Action dated Apr. 1, 2022 for U.S. Appl. No.
17/097,505.

* cited by examiner

204

210

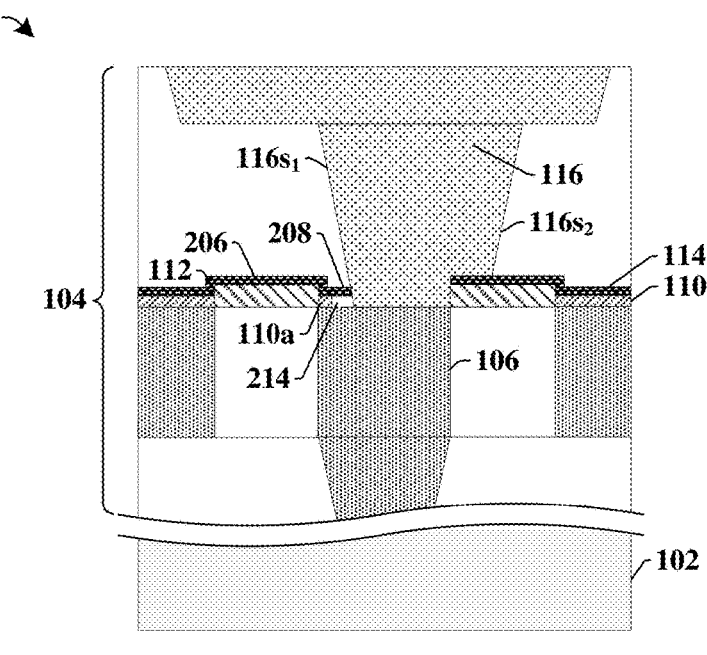
Fig. 2D
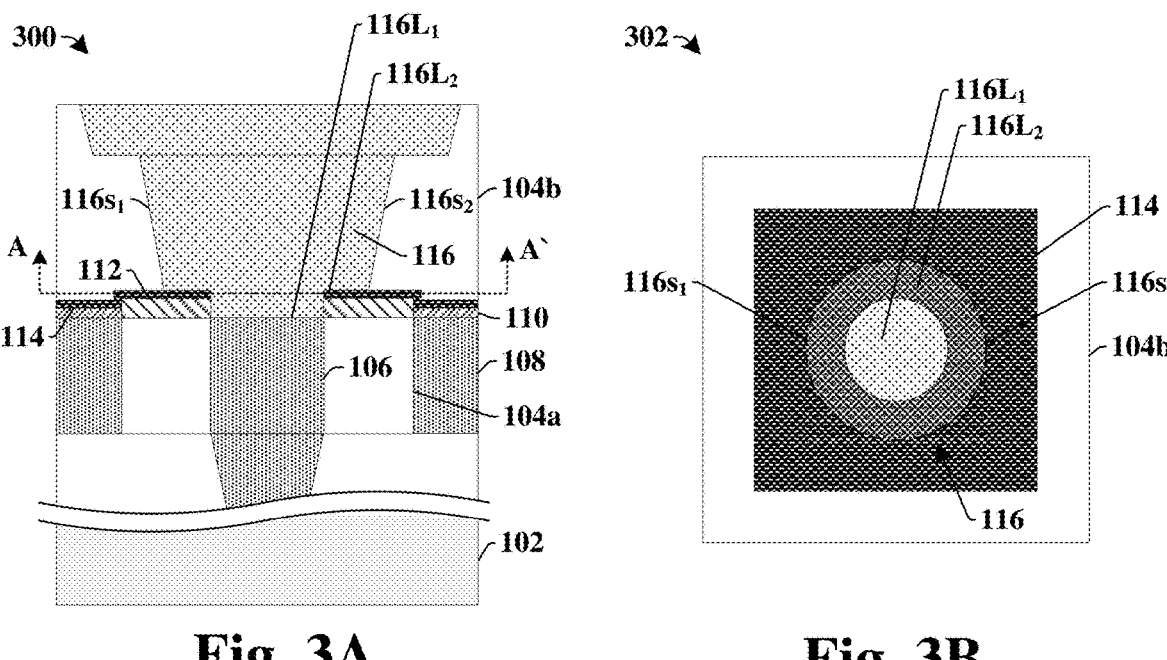
Fig. 3A                    Fig. 3B

400

402

1000

1100

1200

1300

1400

1500

2100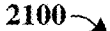

| |
|---|
| Form lower interconnect within lower ILD layer over substrate |

2102

| |
|---|
| Form conductive layer over lower interconnect and lower ILD layer |

2104

| |
|---|
| Pattern conductive layer to define first interconnect and second interconnect |

2106

| |
|---|
| Form dielectric material over and between first and second interconnects |

2108

| |
|---|
| Perform planarization process to remove part of dielectric material and to define first ILD layer between first and second interconnects |

2110

| |
|---|
| Form interconnect patterning layer on first and second interconnects |

2112

| |
|---|
| Form lower etch stop structure over first ILD layer and between sidewalls of interconnect patterning layer |

2114

| |
|---|
| Form upper etch stop structure to continuously extend over lower etch stop structure and interconnect patterning layer |

2116

| |
|---|
| Form second ILD layer on upper etch stop structure |

2118

| |
|---|
| Form intermediate interconnect opening within second ILD layer that exposes interconnect patterning layer |

2120

| |
|---|
| Remove part interconnect patterning layer to form interconnect opening exposing first interconnect |

2122

| |
|---|
| Form conductive material within interconnect opening |

INTERCONNECT STRUCTURE

REFERENCE TO RELATED APPLICATION

This Application is a Divisional of U.S. application Ser. No. 17/097,505, filed on Nov. 13, 2020, the contents of which are hereby incorporated by reference in their entirety.

BACKGROUND

Modern day integrated chips comprise millions or billions of transistor devices formed on a semiconductor substrate (e.g., a silicon substrate). The semiconductor devices are electrically coupled together by conductive interconnects. The conductive interconnects comprise interconnect wires and interconnect vias disposed within a dielectric structure over the semiconductor substrate. By electrically coupling the semiconductor devices together, the conductive interconnects allow the semiconductor devices to perform logical functions that enable operation of an integrated chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D illustrate cross-sectional views of some additional embodiments of integrated chips having a misaligned interconnect within an interconnect structure comprising an interconnect patterning layer.

FIGS. 3A-3B illustrate some additional embodiments of an integrated chip having an interconnect structure comprising an interconnect patterning layer.

FIG. 21 illustrates a flow diagram of some embodiments of a method of forming an integrated chip having an interconnect structure comprising an interconnect patterning layer.

DETAILED DESCRIPTION

Figure 1:
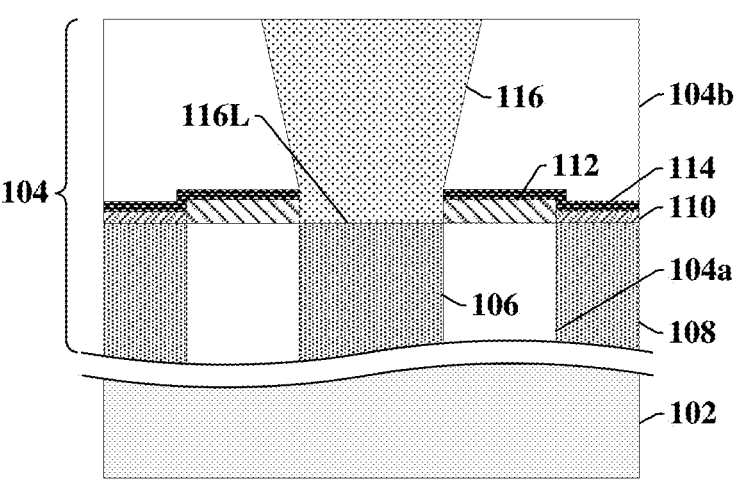
FIG. 1 illustrates a cross-sectional view of some embodiments of an integrated chip having an interconnect structure comprising an interconnect patterning layer that is configured to reduce inter-level dielectric (ILD) damage due to misalignment errors.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips generally comprise a front-end-of-the-line (FEOL) and a back-end-of-the-line (BEOL). The FEOL has transistor devices disposed on and/or within a substrate. The BEOL has conductive interconnects disposed within an inter-level dielectric (ILD) structure over the substrate. The interconnects comprise interconnect wires that are configured to provide lateral routing over the substrate. The interconnects also comprise interconnect vias, which are configured to provide vertical routing between adjacent interconnect wires. The ILD structure is configured to electrically isolate adjacent interconnects from one another.

Interconnects may be formed using a damascene process. A damascene process may be performed by forming an ILD layer over a substrate and patterning the ILD layer to form an interconnect opening. A conductive material is formed within the interconnect opening followed by a planarization process that removes excess of the conductive material from over the ILD layer to define an interconnect. In some cases, a misalignment error (e.g., an overlay shift) may occur during patterning of the ILD layer. Because of the misalignment error, the patterning may damage (e.g., remove) some of the ILD layer around an intended area of the interconnect opening. The damage caused to the ILD layer may reduce a lateral distance between the interconnect and an adjacent interconnect. Reducing a lateral distance between adjacent interconnects can negatively impact a reliability of the ILD layer (e.g., result in electrical shorts between the adjacent interconnects and/or reduce a time dependent dielectric breakdown (TDDB) of the ILD layer). Further, reducing the lateral distance between adjacent interconnects may also negatively impact a performance of an integrated chip by increasing a capacitance between the adjacent interconnects and hence a resistance-capacitance (RC) delay of the integrated chip.

In some embodiments, the present disclosure relates to a method of forming an integrated chip that utilizes an interconnect patterning layer to mitigate ILD damage between adjacent interconnects. The method may comprise forming a first interconnect within a first ILD layer over a substrate. A lower etch stop structure is formed to cover the first ILD layer and an interconnect patterning layer is formed to cover the first interconnect. A second ILD layer is formed over the lower etch stop structure and the interconnect patterning layer. An intermediate interconnect opening is formed within the second ILD layer to expose upper surfaces of the interconnect patterning layer and the lower etch stop structure. A selective etching process is subsequently performed to remove the interconnect patterning layer without etching completely through lower etch stop structure. The selective etching process defines an interconnect opening that exposes an upper surface of the first interconnect without exposing the first ILD layer. A conductive material is subsequently formed within the interconnect opening. By using a selective etching process to remove the interconnect patterning layer without etching completely through lower etch stop structure, damage to the first ILD layer is mitigated and a reliability and/or a performance of the integrated chip is improved.

FIG. 1 illustrates a cross-sectional view of some embodiments of an integrated chip 100 having an interconnect structure comprising an interconnect patterning layer that is configured to reduce ILD damage due to misalignment errors.

The integrated chip 100 comprises an inter-level dielectric (ILD) structure 104 disposed over a substrate 102. In some embodiments, the ILD structure 104 comprises a first ILD layer 104a and a second ILD layer 104b over the first ILD layer 104a. The first ILD layer 104a surrounds a plurality of interconnects. In some embodiments, the plurality of interconnects comprise a first interconnect 106 and a second interconnect 108. A lower etch stop structure 112 is arranged on the first ILD layer 104a and an interconnect patterning layer 110 is arranged on one or more of the plurality of interconnects (e.g., on the second interconnect 108). In some embodiments, the interconnect patterning layer 110 has an outer sidewall laterally contacting an outer sidewall of the lower etch stop structure 112. An upper etch stop structure 114 is arranged on the lower etch stop structure 112 and the interconnect patterning layer 110. In some embodiments, the upper etch stop structure 114 continuously extends from directly over the lower etch stop structure 112 to directly over the interconnect patterning layer 110. In some embodiments, the lower etch stop structure 112 is completely confined above the first ILD layer 104a, while a continuous segment of the interconnect patterning layer 110 is completely confined above the second interconnect 108.

The second ILD layer 104b is arranged over the upper etch stop structure 114. The second ILD layer 104b laterally surrounds a third interconnect 116. The third interconnect 116 vertically extends through the lower etch stop structure 112 and the upper etch stop structure 114 to contact the first interconnect 106. The third interconnect 116 has a lower surface 116L that is confined above an upper surface of the first interconnect 106.

The interconnect patterning layer 110 comprises and/or is a different material than the lower etch stop structure 112 and/or the upper etch stop structure 114. The different materials of the interconnect patterning layer 110 and the lower etch stop structure 112 and/or the upper etch stop structure 114 have different etching rates when exposed to one or more etchants. For example, the interconnect patterning layer 110 may comprise a material that is etched at a higher rate by an etchant than the lower etch stop structure 112 and/or the upper etch stop structure 114. The difference in etching rates between the materials of the interconnect patterning layer 110 and the lower etch stop structure 112 and/or the upper etch stop structure 114 allows for a fabrication process to selectively expose upper surfaces of one or more of the plurality of interconnects without exposing an upper surface of the first ILD layer 104a.

For example, during fabrication of the integrated chip 100, an interconnect opening configured to contain the third interconnect 116 may be formed using an etching process that removes the interconnect patterning layer 110 without completely removing the lower etch stop structure 112 and/or the upper etch stop structure 114. By selectively exposing the first interconnect 106 without exposing the first ILD layer 104a, etch damage to the first ILD layer 104a due to misalignment errors can be mitigated and a reliability of the integrated chip 100 can be increased.

Figure 2A:
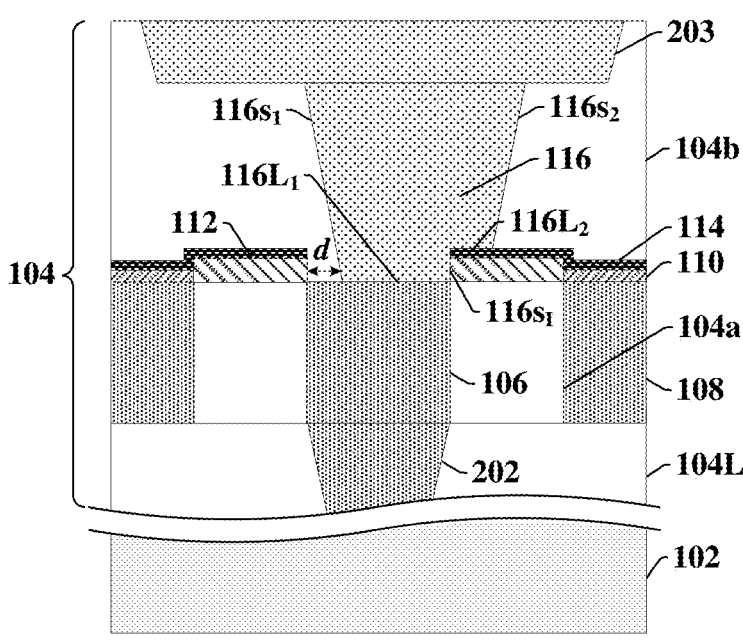

FIG. 2A illustrates a cross-sectional view of some embodiments of an integrated chip 200 having a misaligned interconnect within an interconnect structure comprising an interconnect patterning layer.

The integrated chip 200 comprises an inter-level dielectric (ILD) structure 104 disposed over a substrate 102. In some embodiments, the ILD structure 104 comprises a lower ILD layer 104L, a first ILD layer 104a over the lower ILD layer 104L, and a second ILD layer 104b over the first ILD layer 104a. In some embodiments, the lower ILD layer 104L, the first ILD layer 104a, and the second ILD layer 104b may comprise one or more of silicon, carbon, oxygen, hydrogen, and/or the like. For example, in various embodiments, the lower ILD layer 104L, the first ILD layer 104a, and/or the second ILD layer 104b may comprise silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

The lower ILD layer 104L surrounds a lower interconnect 202 and the first ILD layer 104a surrounds a first interconnect 106 disposed over the lower interconnect 202 and a second interconnect 108. In some alternative embodiments (not shown), a single ILD layer may surround the lower interconnect 202, the first interconnect 106, and the second interconnect 108. In some embodiments, the lower interconnect 202 may comprise one or more of a middle of line (MOL) interconnect, a conductive contact, an interconnect wire, interconnect via, or the like. A lower etch stop structure 112 is arranged on the first ILD layer 104a and an interconnect patterning layer 110 is arranged on the second interconnect 108. An upper etch stop structure 114 is arranged on both the lower etch stop structure 112 and the interconnect patterning layer 110.

The interconnect patterning layer 110 comprises a material that has a high etching selectivity with respect to one or more materials of the lower etch stop structure 112 and/or the upper etch stop structure 114. For example, in some embodiments, a material of the interconnect patterning layer 110 may etch ten or more times faster than one or more materials of the lower etch stop structure 112 and/or the upper etch stop structure 114. The high etching selectivity allows for the lower etch stop structure 112 and/or the upper etch stop structure 114 to protect the first ILD layer 104a during fabrication of the integrated chip 200. In some embodiments, the interconnect patterning layer 110 may comprise a conductive material having a relatively low sheet resistance (e.g., a sheet resistance of less than 2,000 ohms/cm², less than 1,000 ohms/cm², less than 500 ohms/cm², or the like). An interconnect patterning layer 110 with a relatively low sheet resistance (e.g., graphene) allows for the interconnect patterning layer 110 to reduce a resistance of the second interconnect 108 by increasing a cross-sectional area through which current can flow. In some embodiments, the interconnect patterning layer 110 may comprise or be graphene, a self-assembled monolayer (e.g., a thiol, a phosphonic acid, etc.), or the like.

In some embodiments, the lower etch stop structure 112 and/or the upper etch stop structure 114 may respectively comprise one or more different etch stop layers having different materials. In various embodiments, the one or more different etch stop layers may comprise silicon, aluminum, yttrium, zirconium, hafnium, oxygen, carbon, nitrogen, and/or the like. For example, the one or more different etch stop layers may comprise silicon oxide, silicon carbide, silicon oxycarbide, silicon nitride, silicon oxynitride, aluminum oxide, yttrium oxide, hafnium oxide, or the like.

The second ILD layer 104$b$ laterally surrounds a third interconnect 116, which vertically extends through the lower etch stop structure 112 and the upper etch stop structure 114 to contact the first interconnect 106. In some embodiments, the second ILD layer 104$b$ may further surround a fourth interconnect 203 that is over the third interconnect 116. The third interconnect 116 is misaligned, so that the third interconnect 116 laterally extends from a first outer sidewall 116$s_1$ that is directly over the first interconnect 106 to a second outer sidewall 116$s_2$ that is laterally outside of the first interconnect 106. In some embodiments, the second outer sidewall 116$s_2$ is directly over the lower etch stop structure 112 and/or the upper etch stop structure 114. In some embodiments, the first outer sidewall 116$s_1$ is laterally separated from an outermost sidewall of the first interconnect 106 by a distance d. In various embodiments, the distance d may be in a range of between approximately 0 nanometers (nm) and approximately 5 nm, between approximately 0 nm and approximately 10 nm, between approximately 0 nm and approximately 15 nm, or other similar values.

The third interconnect 116 comprises a first lower surface 116$L_1$ that is on the first interconnect 106 and a second lower surface 116$L_2$ that is directly over the lower etch stop structure 112 and/or the upper etch stop structure 114. The first lower surface 116$L_1$ laterally extends between the first outer sidewall 116$s_1$ and an interior sidewall 116$s_f$, while the second lower surface 116$L_2$ laterally extends between the second outer sidewall 116$s_2$ and the interior sidewall 116$s_f$. The interior sidewall 116$s_f$ is vertically between the first lower surface 116$L_1$ and the second lower surface 116$L_2$. In some embodiments, the interior sidewall 116$s_f$ may laterally contact a sidewall of the lower etch stop structure 112 and/or a sidewall of the upper etch stop structure 114. In some embodiments, the third interconnect 116 is asymmetric with respect to a line bisecting the third interconnect 116.

Figure 2B:
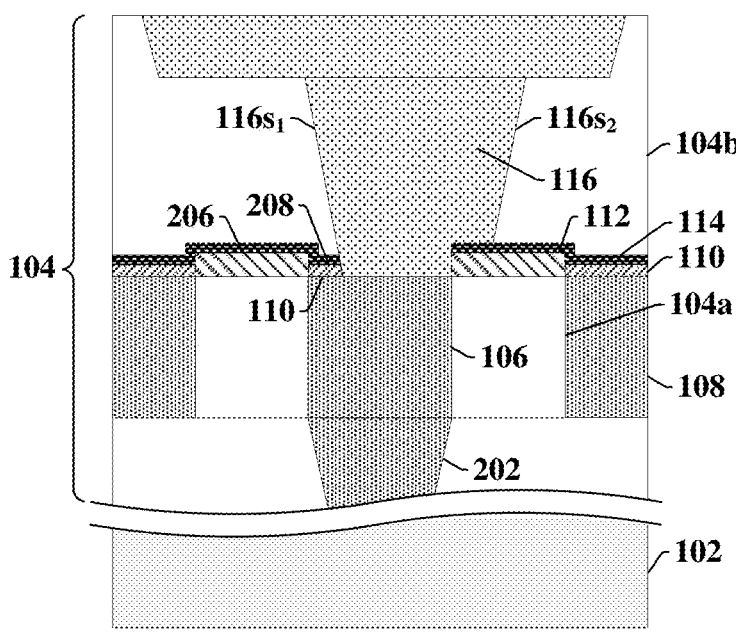

FIG. 2B illustrates a cross-sectional view of some additional embodiments of an integrated chip 204 having a misaligned interconnect within an interconnect structure comprising an interconnect patterning layer.

The integrated chip 204 comprises a first ILD layer 104$a$ disposed over a substrate 102. The first ILD layer 104$a$ laterally surrounds a first interconnect 106 disposed over a lower interconnect 202 and a second interconnect 108. A lower etch stop structure 112 is arranged on the first ILD layer 104$a$ and an interconnect patterning layer 110 is arranged on the first interconnect 106 and the second interconnect 108. In some embodiments, the interconnect patterning layer 110 may comprise a conductive material that is configured to reduce a resistance of the first interconnect 106 and the second interconnect 108. In some embodiments, the interconnect patterning layer 110 covers an entirety of the second interconnect 108, but does not cover an entirety of the first interconnect 106. An upper etch stop structure 114 is arranged on the lower etch stop structure 112 and the interconnect patterning layer 110.

A third interconnect 116 is disposed within a second ILD layer 104$b$ over the upper etch stop structure 114. The third interconnect 116 vertically extends through the lower etch stop structure 112 and the upper etch stop structure 114 to contact the first interconnect 106. The third interconnect 116 comprises a first outer sidewall 116$s_1$ that is directly over the first interconnect 106 and a second outer sidewall 116$s_2$ that is directly over the lower etch stop structure 112 and/or the upper etch stop structure 114. In some embodiments, the upper etch stop structure 114 continuously extends from a first lower surface 206 that is directly over the lower etch stop structure 112 to a second lower surface 208 that is laterally between the first outer sidewall 116$s_1$ and the lower etch stop structure 112. In some embodiments, the second ILD layer 104$b$ continuously extends from a lower surface that is directly over the lower etch stop structure 112 to a lower surface that is directly over the interconnect patterning layer 110.

In some embodiments, the interconnect patterning layer 110 is arranged vertically below the second lower surface 208 of the upper etch stop structure 114 and laterally between the first outer sidewall 116$s_1$ and the lower etch stop structure 112. In some embodiments, the third interconnect 116 extends from a bottom surface of the interconnect patterning layer 110 to vertically past a top surface of the interconnect patterning layer 110. In some embodiments, the interconnect patterning layer 110 and the third interconnect 116 have bottommost surfaces that are substantially aligned.

Figure 2C:
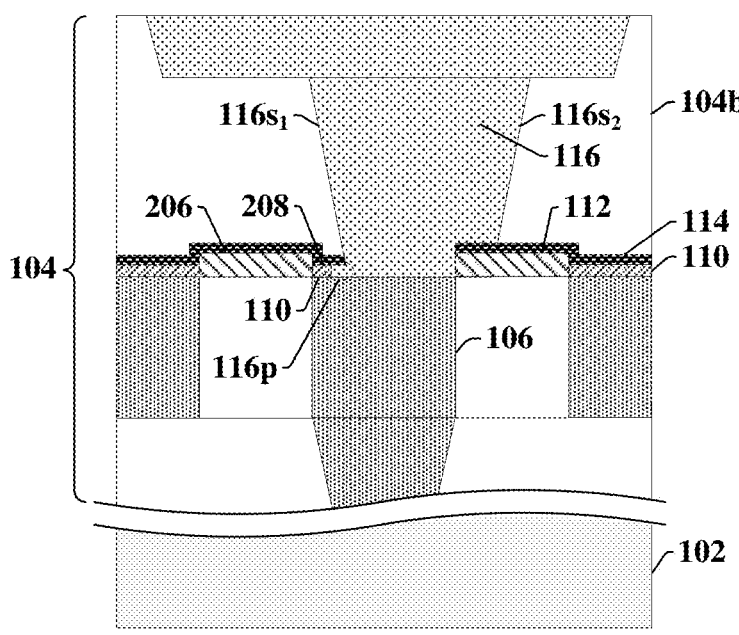

FIGS. 2C and 2D illustrate cross-sectional views of some additional embodiments of integrated chips, 210 and 212, having a misaligned interconnect within an interconnect structure comprising an interconnect patterning layer.

As shown in FIG. 2C, the integrated chip 210 comprises an interconnect patterning layer 110 disposed laterally between a first outer sidewall 116$s_f$ of a third interconnect 116 and a sidewall of a lower etch stop structure 112. An upper etch stop structure 114 is arranged over the interconnect patterning layer 110 and a second ILD layer 104$b$ is disposed over the upper etch stop structure 114. The upper etch stop structure 114 has a first lower surface 206 that is directly over the lower etch stop structure 112 and a second lower surface 208 that vertically contacts a top of the interconnect patterning layer 110 between the first outer sidewall 116$s_1$ and the lower etch stop structure 112.

In some embodiments, the second lower surface 208 laterally extends past the outer sidewall of the interconnect patterning layer 110 due to an etching selectivity, between the upper etch stop structure 114 and the interconnect patterning layer 110, of an etching process used to form an interconnect opening within the second ILD layer 104$b$. The etching selectivity results in a lateral etch back of the interconnect patterning layer 110 during formation of the third interconnect 116. In other embodiments (not shown), the etching process may completely remove the interconnect patterning layer 110.

In some embodiments, the third interconnect 116 comprises a protrusion 116$p$ that protrudes outward form the first outer sidewall 116$s_1$ of the third interconnect 116 to below the second lower surface 208 of the upper etch stop structure 114. In some embodiments, the protrusion 116$p$ contacts a sidewall of the interconnect patterning layer 110. In other embodiments shown in integrated chip 212 of FIG. 2D, a sidewall of the interconnect patterning layer 110 may be separated from the third interconnect 116 by a gap 214 defined by sidewalls of the third interconnect 116 and the interconnect patterning layer 110. In various embodiments, the gap 214 may be filled will a gas, such as air, nitrogen, or the like. In some embodiments (not shown), the third interconnect 116 may comprise a protrusion that is separated from the interconnect patterning layer 110 by a gap.

FIG. 3A illustrates a cross-sectional view of some additional embodiments of an integrated chip 300 having an interconnect structure comprising an interconnect patterning layer.

The integrated chip 300 comprises a first interconnect 106 and a second interconnect 108 disposed within a first ILD layer 104a. A lower etch stop structure 112 is arranged on the first ILD layer 104a, and an interconnect patterning layer 110 is disposed on the second interconnect 108 and between sidewalls of the lower etch stop structure 112. An upper etch stop structure 114 is on the lower etch stop structure 112 and the interconnect patterning layer 110.

A third interconnect 116 is disposed within a second ILD layer 104b over the upper etch stop structure 114. The third interconnect 116 vertically extends through the lower etch stop structure 112 and the upper etch stop structure 114. In some embodiments, the third interconnect 116 has a first width that is larger than a second width of an upper surface of the first interconnect 106. In some such embodiments, the third interconnect 116 laterally extends from a first outer sidewall $116s_1$ that is directly over the lower etch stop structure 112 and/or the upper etch stop structure 114 to a second outer sidewall $116s_2$ that is directly over the lower etch stop structure 112 and/or the upper etch stop structure 114.

Having a third interconnect 116 with a first width that is larger than a second width of the upper surface of the first interconnect 106 reduces a resistance of the third interconnect 116 and therefore can improve a performance of the integrated chip 300. Furthermore, the lower etch stop structure 112 and the upper etch stop structure 114 prevent the third interconnect from damaging the first ILD layer 104a.

In some embodiments, the third interconnect 116 comprises a first lower surface $116L_1$ that is directly over the first interconnect 106 and a second lower surface $116L_2$ that is separated from the first ILD layer 104a by the lower etch stop structure 112 and/or the upper etch stop structure 114. In some embodiments, shown in top-view 302 of FIG. 3B (taken along cross-sectional line A-A' of FIG. 3A), the second lower surface $116L_2$ may extend in a continuous loop around the first lower surface $116L_1$. In some embodiments, the first width of third interconnect 116 may be measured between outermost edges of the second lower surface $116L_2$.

Figure 4A:
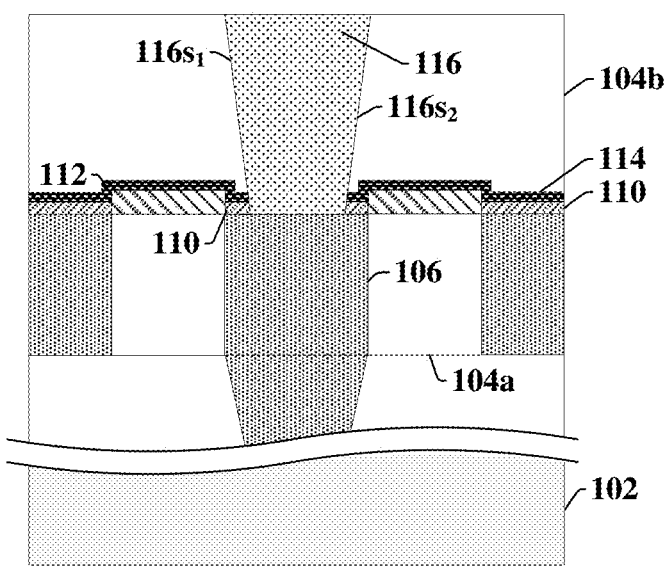
FIGS. 4A-4B illustrate some additional embodiments of an integrated chip having an interconnect structure comprising an interconnect patterning layer.
Figure 4B:
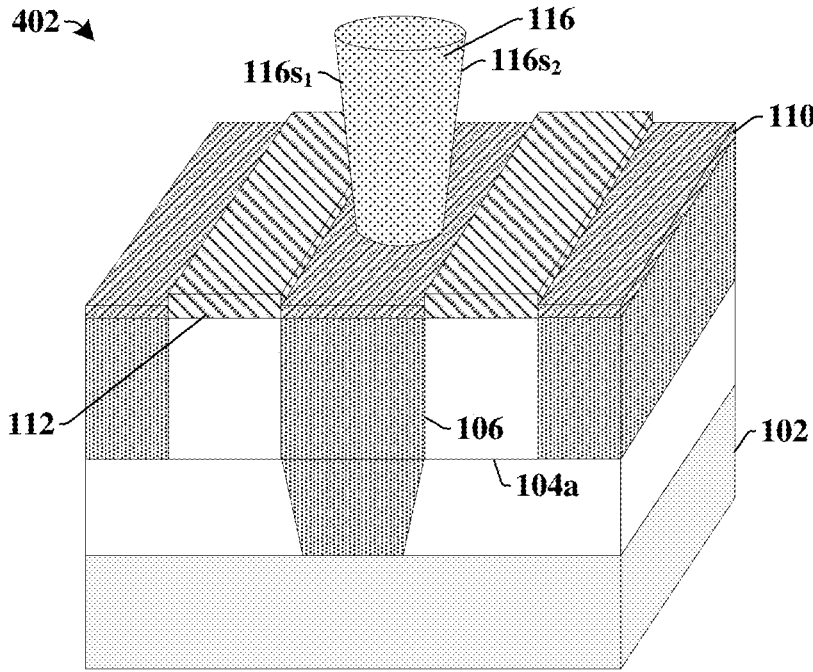

FIGS. 4A-4B illustrate some additional embodiments of an integrated chip having an interconnect structure comprising an interconnect patterning layer.

FIG. 4A illustrates a cross-sectional view of some embodiments of an integrated chip 400 having a first interconnect 106 and a second interconnect 108 disposed within a first ILD layer 104a over a substrate 102. A lower etch stop structure 112 is arranged on the first ILD layer 104a, and an interconnect patterning layer 110 is disposed on the second interconnect 108 and between sidewalls of the lower etch stop structure 112. An upper etch stop structure 114 is on the lower etch stop structure 112 and the interconnect patterning layer 110.

A third interconnect 116 is disposed within a second ILD layer 104b over the upper etch stop structure 114. The third interconnect 116 vertically extends through the upper etch stop structure 114 and an interconnect patterning layer 110 on the first interconnect 106. In some embodiments, the third interconnect 116 comprises a first outer sidewall $116s_1$ and a second outer sidewall $116s_2$ that are both directly over the first interconnect 106.

FIG. 4B illustrates a three-dimensional view 402 of some embodiments of the integrated chip 400 of FIG. 4A. The three-dimensional view excludes the upper etch stop structure (114 of FIG. 4B) and the second ILD layer (104b of FIG. 4B) to more clearly show the interconnect patterning layer 110. As shown in three-dimensional view 402, the interconnect patterning layer 110 covers an upper surface of the first interconnect 106 along a length of the first interconnect 106. Because the interconnect patterning layer 110 covers the upper surface of the first interconnect 106 along a length of the first interconnect 106, a relatively low resistance of the interconnect patterning layer 110 (e.g., graphene) provides the first interconnect 106 with a relatively low overall resistance that can improve performance of the integrated chip 400.

Figure 5:
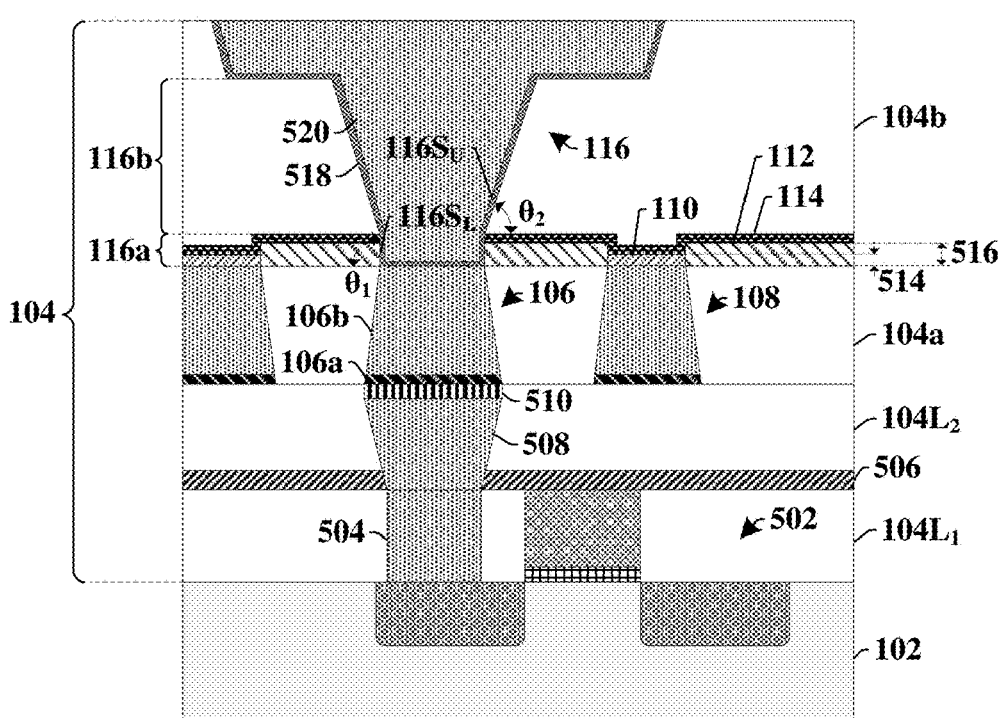
FIG. 5 illustrates a cross-sectional view of some additional embodiments of an integrated chip having an interconnect structure comprising an interconnect patterning layer.

FIG. 5 illustrates a cross-sectional view of some additional embodiments of an integrated chip 500 having an interconnect structure comprising an interconnect patterning layer.

The integrated chip 500 comprises a transistor device 502 arranged on and/or within a substrate 102. In some embodiments, the transistor device 502 may comprise a MOSFET (metal oxide semiconductor field-effect transistor), a BJT (bipolar junction transistor), a JFET (junction gate field-effect transistor), or the like. In some embodiments, the transistor device 502 may comprise a planar FET, a FinFET, or a gate all around (GAA) device.

The transistor device 502 is coupled to a first lower interconnect 504 disposed within a first lower ILD layer $104L_1$ over the substrate 102. In some embodiments, the first lower interconnect 504 is further coupled to a second lower interconnect 508 surrounded by a second lower ILD layer $104L_2$. In some embodiments, a lower etch stop layer 506 separates the first lower ILD layer $104L_1$ and the second lower ILD layer $104L_2$. In some embodiments, a capping layer 510 may be arranged along an upper surface of the second lower interconnect 508. The capping layer 510 is configured to reduce electromigration. In some embodiments, the capping layer 510 may comprise cobalt, tungsten, nickel, molybdenum, phosphorous, silicon nitride, or the like.

A first ILD layer 104a is disposed over the second lower ILD layer $104L_2$. The first ILD layer 104a laterally surrounds a first interconnect 106 and a second interconnect 108. In some embodiments, the first interconnect 106 may comprise a glue layer 106a and a metal layer 106b over the glue layer 106a. In some embodiments, the glue layer 106a may comprise one or more of silicon, aluminum, titanium, tantalum, tungsten, carbon, oxygen, nitrogen, or the like. In some embodiments, the metal layer 106b may comprise one or more of copper, aluminum, tungsten, or the like. In some embodiments, the first interconnect 106 has one or more sidewalls that are angled so that a width of the first interconnect 106 decreases as a height over the substrate 102 increases.

A lower etch stop structure 112 is arranged on the first ILD layer 104a and an interconnect patterning layer 110 is disposed on the second interconnect 108 and between sidewalls of the lower etch stop structure 112. An upper etch stop structure 114 is on the lower etch stop structure 112 and the interconnect patterning layer 110. In some embodiments, the interconnect patterning layer 110 has a first height 514 that is smaller than a second height 516 of the lower etch stop structure 112. In some embodiments, the first height 514 may be in a range of between approximately 1 nm to approximately 10 nm. In some embodiments, the second height 516 may be in a range of between approximately 1 nm to approximately 20 nm.

A second ILD layer 104b is over the upper etch stop structure 114 and surrounds a third interconnect 116. In some embodiments, the third interconnect 116 may comprise a barrier layer 518 and a conductive core 520. In some embodiments, the barrier layer 518 may comprise tantalum, tungsten, tantalum nitride, tungsten nitride, or the like. In some embodiments, the conductive core 520 may comprise copper, aluminum, ruthenium, cobalt, tungsten, or the like.

In some embodiments, the third interconnect 116 has one or more sidewalls angled so that a width of the third interconnect 116 increases as a height over the substrate 102 increases. In some embodiments, the third interconnect 116 has a first segment 116a having a lower sidewall $116S_L$ that is angled at a first slope and a second segment 116b having an upper sidewall $116S_u$ angled at a second slope that is smaller than the first slope. In such embodiments, the lower sidewall $116S_L$ is angled at a first angle θ1 and the upper sidewall $116S_u$ is angled at a second angle θ2 that is smaller than the first angle θ1. In such embodiments, the first angle θ1 and the second angle θ2 are measured outside of the third interconnect 116 (i.e., not measured through the third interconnect 116) and with respect to a horizontal plane that is parallel to an interface between the substrate 102 and ILD structure 104.

Figure 6:
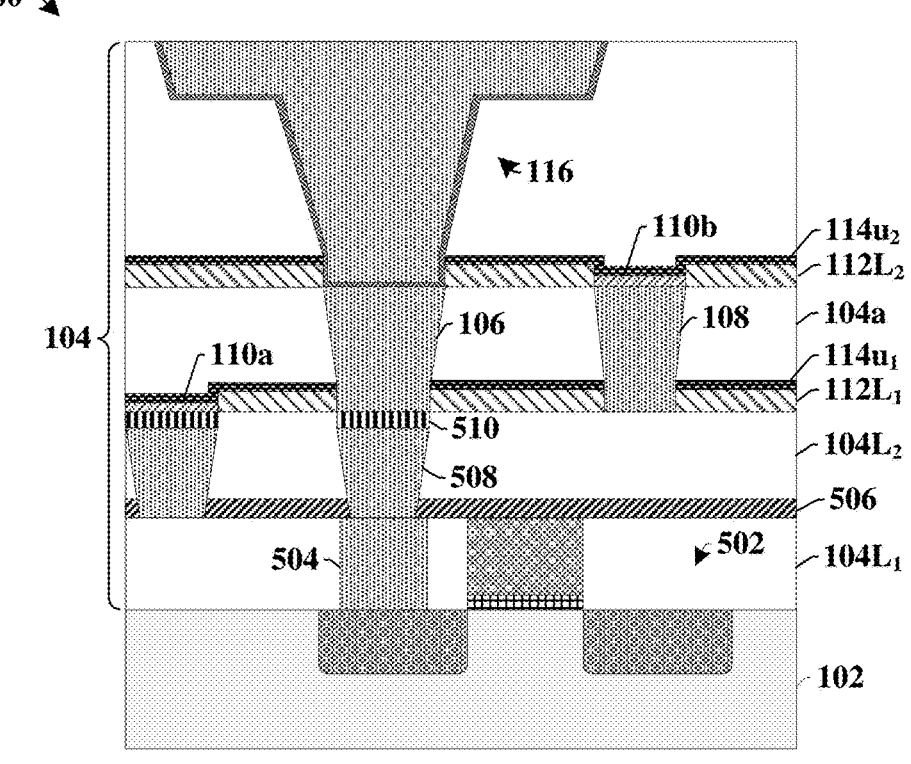
FIG. 6 illustrates a cross-sectional view of some additional embodiments of an integrated chip having an interconnect structure comprising an interconnect patterning layer.

FIG. 6 illustrates a cross-sectional view of some additional embodiments of an integrated chip 600 having an interconnect structure comprising an interconnect patterning layer.

The integrated chip 600 comprises a first interconnect 106 and a second interconnect 108 disposed within a first ILD layer 104a over a substrate 102. A first upper etch stop structure $114u_1$ is arranged along a lower surface of the first ILD layer 104a. The first upper etch stop structure $114u_1$ vertically separates the first ILD layer 104a from a first interconnect patterning layer 110a and a first lower etch stop structure $112_{L1}$. A second lower etch stop structure $112_{L2}$ is arranged on an upper surface of the first ILD layer 104a and a second interconnect patterning layer 110b is arranged on the second interconnect 108. A second upper etch stop structure $114u2$ continuously extends over the second lower etch stop structure $112_{L2}$ and the second interconnect patterning layer 110b.

Figure 7A:
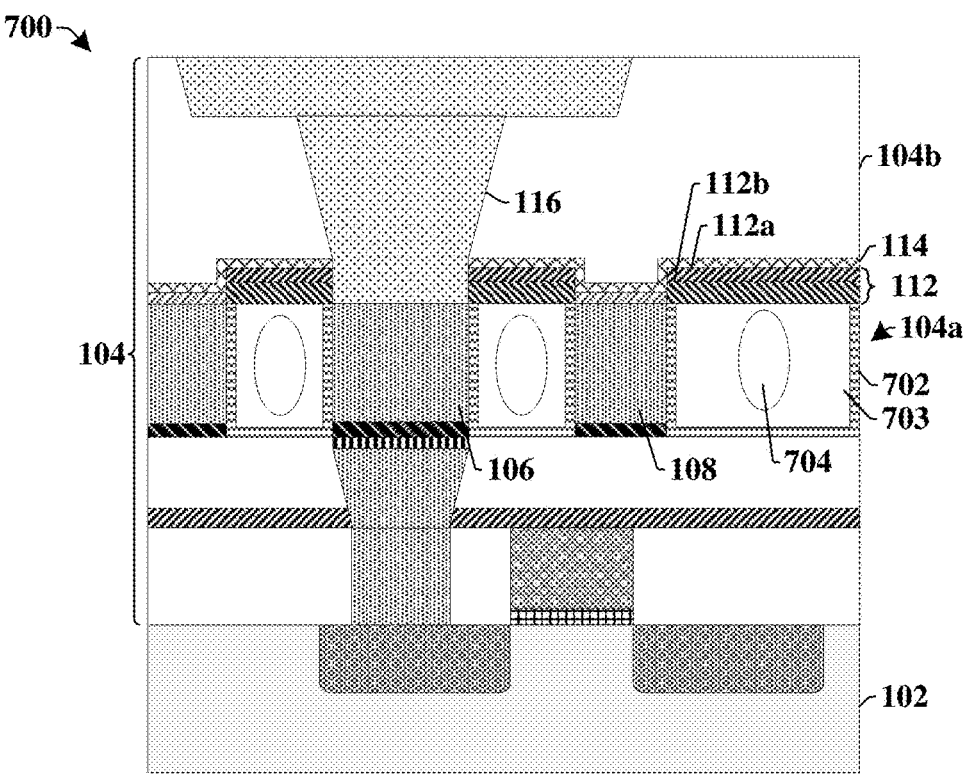
FIGS. 7A-7D illustrate cross-sectional views of some additional embodiments of integrated chips having an interconnect structure comprising an interconnect patterning layer.

FIG. 7A illustrates a cross-sectional view of some additional embodiments of an integrated chip 700 having an interconnect structure comprising an interconnect patterning layer.

The integrated chip 700 comprises a first interconnect 106 and a second interconnect 108 disposed within a first ILD layer 104a over a substrate 102. In some embodiments, the first ILD layer 104a may comprise a dielectric material 703 separated from the first interconnect 106 and the second interconnect 108 by way of an encapsulation layer 702. The encapsulation layer 702 is configured to prevent diffusion of metal atoms from the first interconnect 106 and the second interconnect 108 into the dielectric material 703. Furthermore, the encapsulation layer 702 may also prevent oxidation of the first interconnect 106 and the second interconnect 108 during formation of the first ILD layer 104a. In some embodiments, the encapsulation layer 702 may comprise silicon, aluminum, tantalum, manganese, carbon, oxygen, nitride, or the like.

In some embodiments, the dielectric material 702 has one or more interior surfaces defining a cavity 704 arranged between the first interconnect 106 and the second interconnect 108. In various embodiments, the cavity 704 may be filled with a gas (e.g., air, nitrogen, oxygen, or the like). The cavity reduces a dielectric constant of the first ILD layer 104a between the first interconnect 106 and the second interconnect 108.

A lower etch stop structure 112 is arranged over the first ILD layer 104a and an interconnect patterning layer 110 is arranged over the second interconnect 108. In some embodiments, the lower etch stop structure 112 may comprise a first lower etch stop layer 112a and a second lower etch stop layer 112b over the first lower etch stop layer 112a. In some embodiments, the first lower etch stop layer 112a has an upper surface directly contacting a lower surface of the second lower etch stop layer 112b. In some embodiments, the first lower etch stop layer 112a continuously extends from the first ILD layer 104a to the second lower etch stop layer 112b. In some embodiments, the second lower etch stop layer 112b continuously extends from the first lower etch stop layer 112a to an upper etch stop structure 114.

In some embodiments, the first lower etch stop layer 112a and the second lower etch stop layer 112b comprise different materials. By having lower etch stop layers comprising different materials, the lower etch stop structure 112 is able to provide an improved resistance to etching and thereby further mitigate damage to the first ILD layer 104a. In some embodiments, the first lower etch stop layer 112a may comprise a lower dielectric constant than the second lower etch stop layer 112b. Having the first lower etch stop layer 112a with a lower dielectric constant than the second lower etch stop layer 112b reduces an RC delay of interconnects within the integrated chip 700, since it increases a distance between the first interconnect 106 and a material having a higher dielectric constant.

Figure 7B:
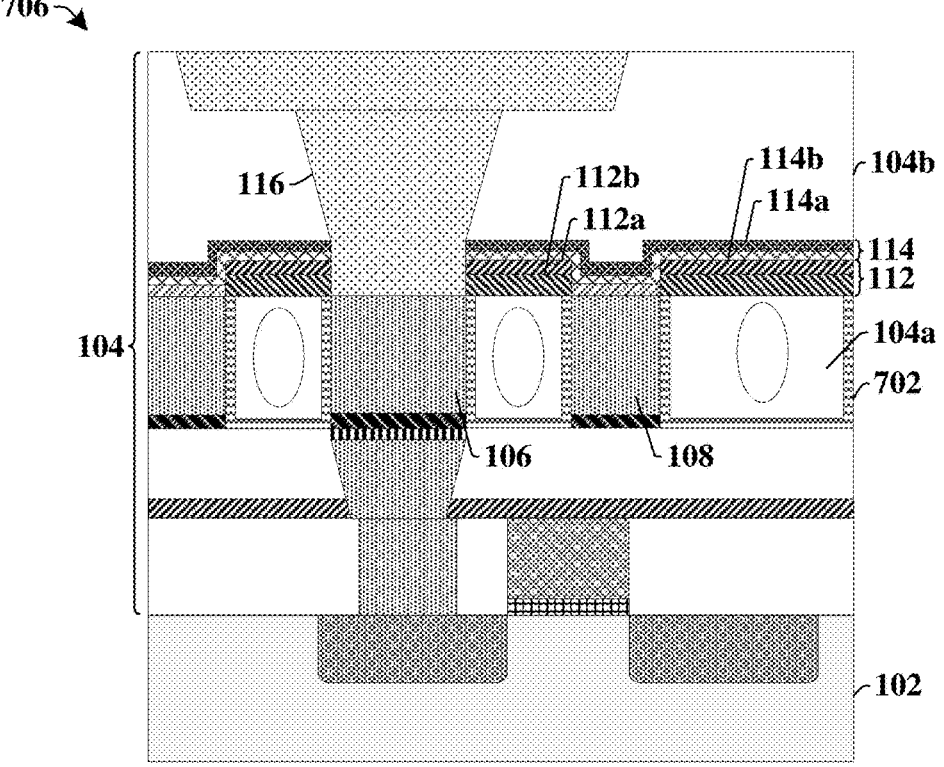

FIG. 7B illustrates a cross-sectional view of some additional embodiments of an integrated chip 706 having an interconnect structure comprising an interconnect patterning layer.

The integrated chip 706 comprises an upper etch stop structure 114 having a first upper etch stop layer 114a and a second upper etch stop layer 114b on the first upper etch stop layer 114a. A second ILD layer 104b is disposed over the second upper etch stop layer 114b. In some embodiments, the first upper etch stop layer 114a contacts a lower etch stop structure 112 and an interconnect patterning layer 110. In some embodiments, the second upper etch stop layer 114b contacts the first upper etch stop layer 114a and the second ILD layer 104b. In some embodiments, the first upper etch stop layer 114a and the second upper etch stop layer 114b comprise different materials. Having the first upper etch stop layer 114a and the second upper etch stop layer 114b comprise different materials allows for the upper etch stop structure 114 to have a greater resistance to etchants and thereby provides for improved control of a profile of the third interconnect 116.

Figure 7C:
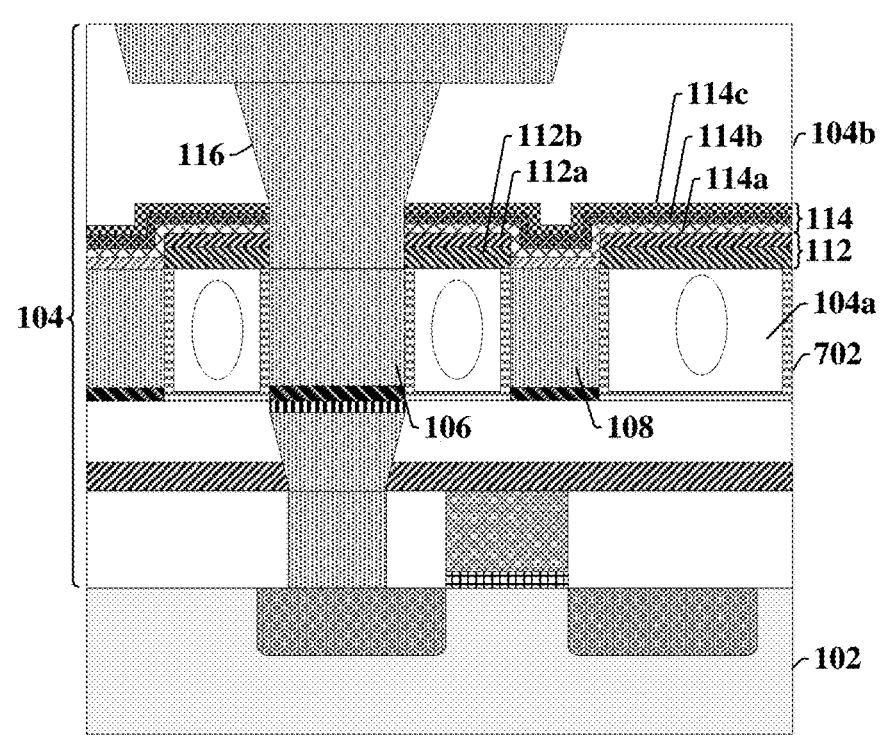

FIG. 7C illustrates a cross-sectional view of some additional embodiments of an integrated chip 708 having an interconnect structure comprising an interconnect patterning layer.

The integrated chip 708 comprises an upper etch stop structure 114 having a first upper etch stop layer 114a, a second upper etch stop layer 114b, and a third upper etch stop layer 114c. A second ILD layer 104b is disposed over the third upper etch stop layer 114c. In some embodiments, the first upper etch stop layer 114a contacts a lower etch stop structure 112 and an interconnect patterning layer 110. In some embodiments, the second upper etch stop layer 114b contacts the first upper etch stop layer 114a and the third upper etch stop layer 114c. In some embodiments, the third upper etch stop layer 114c contacts the second upper etch stop layer 114b and the second ILD layer 104b. In some embodiments, the first upper etch stop layer 114a, the second upper etch stop layer 114b, and the third upper etch stop layer 114c may comprise two or more different materials. Having the first upper etch stop layer 114a, the second upper etch stop layer 114b, and the third upper etch stop layer 114c comprise two or more different materials allows for the upper etch stop structure 114 to have a greater resistance to etchants and thereby provides for improved control of a profile of the third interconnect 116.

Figure 7D:
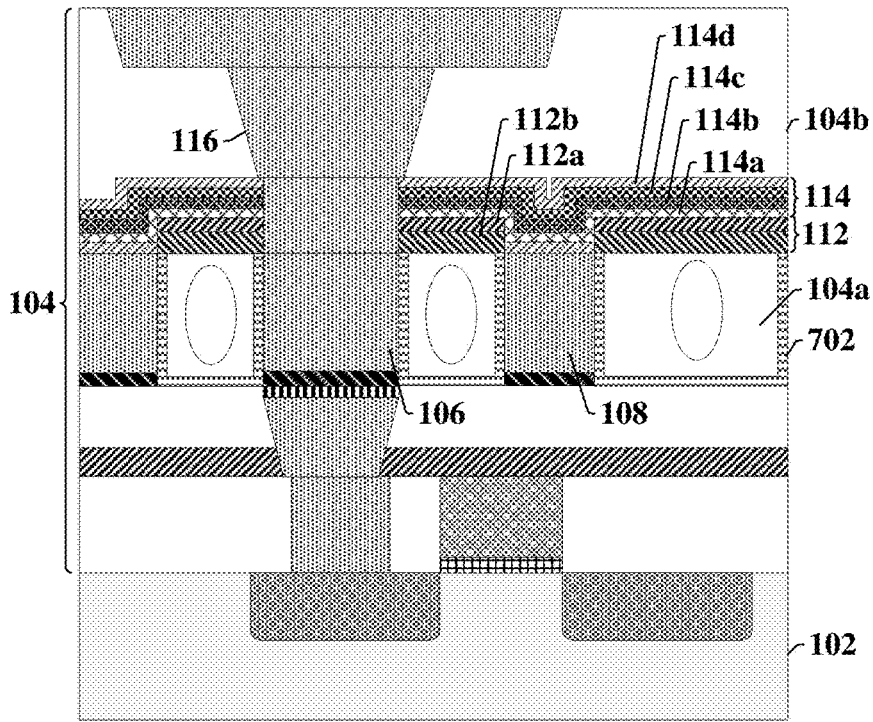

FIG. 7D illustrates a cross-sectional view of some additional embodiments of an integrated chip 710 having an interconnect structure comprising an interconnect patterning layer.

The integrated chip 710 comprises a first upper etch stop layer 114a, a second upper etch stop layer 114b, a third upper etch stop layer 114c, and a fourth upper etch stop layer 114d. A second ILD layer 104b is disposed over the fourth upper etch stop layer 114d. In some embodiments, the first upper etch stop layer 114a has a lower surface contacting a lower etch stop structure 112, the second upper etch stop layer 114b has a lower surface contacting the first upper etch stop layer 114a, the third upper etch stop layer 114c has a lower surface contacting the second upper etch stop layer 114b, and the fourth upper etch stop layer 114d has a lower surface contacting the third upper etch stop layer 114c and an upper surface contacting the second ILD layer 104b. In some embodiments, the first upper etch stop layer 114a, the second upper etch stop layer 114b, the third upper etch stop layer 114c, and the fourth upper etch stop layer 114d may comprise two or more different materials. Having the first upper etch stop layer 114a, the second upper etch stop layer 114b, the third upper etch stop layer 114c, and the fourth upper etch stop layer 114d comprise two or more different materials allows for the upper etch stop structure 114 to have a greater resistance to etchants and thereby provides for improved control of a profile of the third interconnect 116.

In some embodiments, one or more of the first upper etch stop layer 114a, the second upper etch stop layer 114b, the third upper etch stop layer 114c, and the fourth upper etch stop layer 114d may have sidewalls that are substantially aligned with one another. In other embodiments (not shown), one or more of the first upper etch stop layer 114a, the second upper etch stop layer 114b, the third upper etch stop layer 114c, and the fourth upper etch stop layer 114d may have sidewalls that are misaligned with one another. For example, in some embodiments, the second upper etch stop layer 114b may have a lower surface that laterally extends past an upper surface of the first upper etch stop layer 114a and an upper surface that laterally extends past a lower surface of the third upper etch stop layer 114c.

FIGS. 8-20 illustrate cross-sectional views of some embodiments of a method of forming an integrated chip having an interconnect structure comprising an interconnect patterning layer. Although FIGS. 8-20 are described in relation to a method, it will be appreciated that the structures disclosed in FIGS. 8-20 are not limited to such a method, but instead may stand alone as structures independent of the method.

Figure 8:
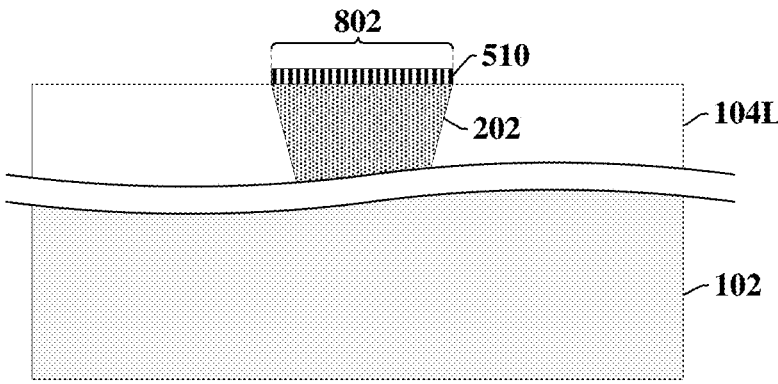
FIGS. 8-20 illustrate cross-sectional views of some embodiments of a method of forming an integrated chip having an interconnect structure comprising an interconnect patterning layer.

As shown in cross-sectional view 800 of FIG. 8, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

In some embodiments, a lower interconnect 202 may be formed within a lower ILD layer 104L formed over the substrate 102. In some embodiments, the lower interconnect 202 may comprise a MOL interconnect, a conductive contact, an interconnect wire, or an interconnect via. In some embodiments, the lower interconnect 202 may be formed by forming the lower ILD layer 104L over the substrate 102, selectively etching the lower ILD layer 104L to form a lower interconnect opening 802 within the lower ILD layer 104L, forming a first conductive material (e.g., copper, aluminum, etc.) within the lower interconnect opening 802, and performing a first planarization process (e.g., a chemical mechanical planarization process) to remove excess of the first conductive material from over the lower ILD layer 104L. In some embodiments, a capping layer 510 may be formed over an upper surface of the lower interconnect 202 after the first planarization process is completed. In some embodiments, the capping layer may comprise cobalt, ruthenium, or the like.

Figure 9:
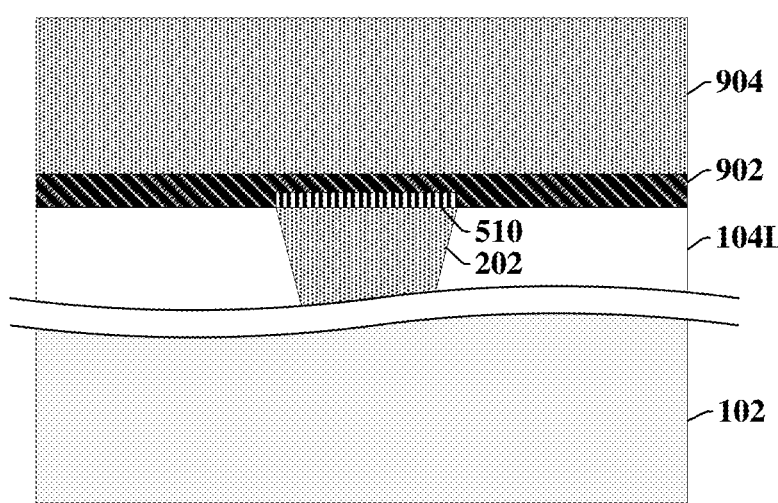

As shown in cross-sectional view 900 of FIG. 9, a conductive layer 904 is formed over the lower ILD layer 104L. In some embodiments, a glue layer 902 may be formed over the lower ILD layer 104L prior to forming the conductive layer 904. In some embodiments, the glue layer 902 may be configured to improve adhesion between abutting layers and/or to mitigate diffusion of atoms between the abutting layers. In some embodiments, the glue layer 902 and/or the conductive layer 904 may be formed by a deposition process (e.g., a physical vapor deposition (PVD) process, a chemical vapor deposition process (CVD), a plasma enhanced CVD (PE-CVD) process, an atomic layer deposition (ALD) process, or the like), a spin-on process, a plating process (e.g., an electroplating process, an electroless plating process, or the like), or the like. In some embodiments, the conductive layer 904 may comprise copper, aluminum, tungsten, or the like. In some embodiments, the glue layer 902 may comprise silicon, aluminum, titanium, tantalum, tungsten, carbon, oxygen, nitrogen, or the like.

Figure 10:
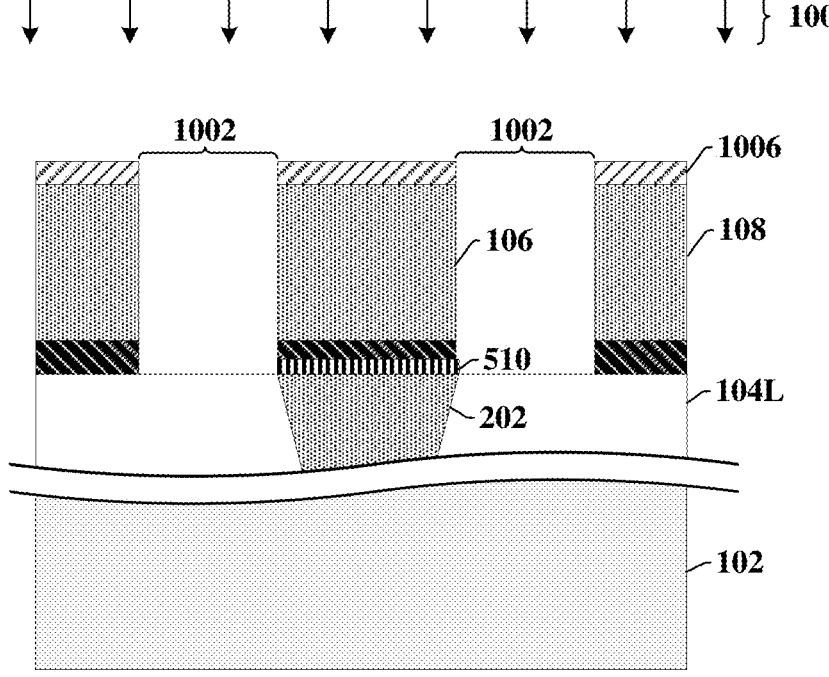

As shown in cross-sectional view 1000 of FIG. 10, a first etching process is performed to selectively pattern the conductive layer (904 of FIG. 9) and the glue layer (902 of FIG. 9). The first etching process removes parts of the conductive layer (904 of FIG. 9) and the glue layer (902 of FIG. 9) to define a plurality of interconnects comprising a first interconnect 106 and a second interconnect 108. The plurality of interconnects are separated by cavities 1002. In some embodiments, the first etching process may be performed by selectively exposing the conductive layer (904 of FIG. 9) and the glue layer (902 of FIG. 9) to a first etchant 1004 according to a first masking layer 1006. In some embodiments, the first etchant 1004 may comprise a dry etchant (e.g., having a fluorine chemistry, a chlorine chemistry, or the like). In other embodiments, the first etchant 1004 may comprise a wet etchant (e.g., comprising hydrofluoric acid, potassium hydroxide, or the like). In some embodiments, the first masking layer 1006 may comprise a photosensitive material (e.g., photoresist), a hard mask, or the like. In some embodiments, the first masking layer 1006 may comprise a hard mask that includes silicon, aluminum, titanium, hafnium, tungsten, carbon, oxygen, nitrogen, or the like.

Figure 11:
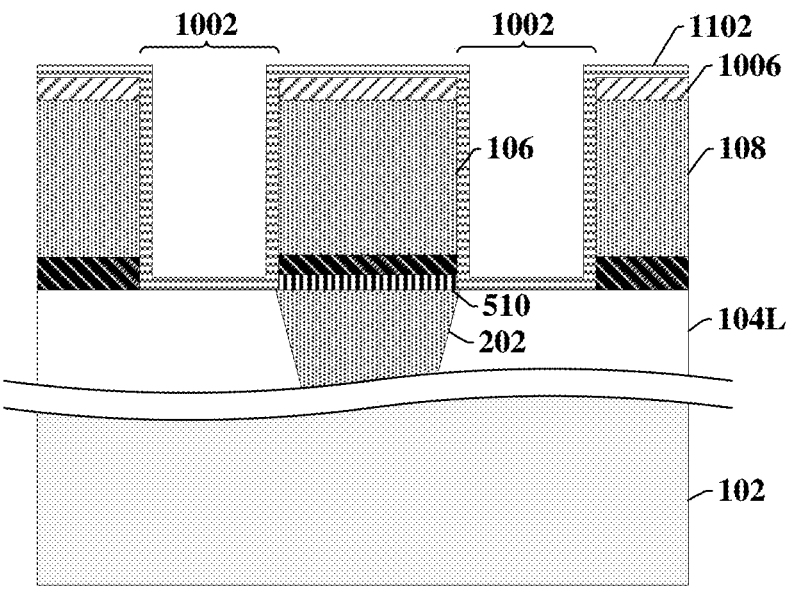

As shown in cross-sectional view 1100 of FIG. 11, an encapsulation layer 1102 is formed over the substrate 102.

The encapsulation layer 1102 continuously extends over the first interconnect 106 and the second interconnect 108 and within the plurality of cavities 1002. In some embodiments, the encapsulation layer 1102 may be formed by a deposition process (e.g., an ALD process, a CVD process, a PE-CVD process, or the like), a spin-on process, or the like.

Figure 12:
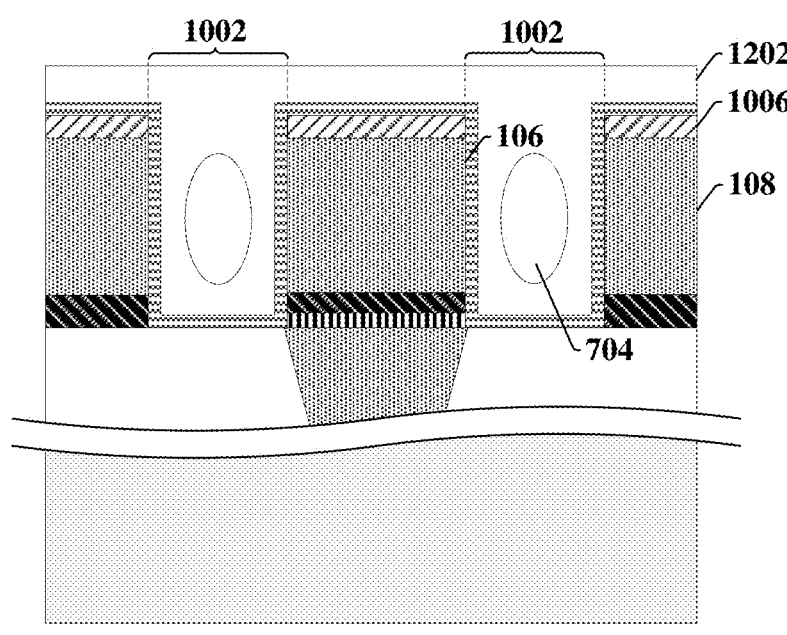

As shown in cross-sectional view 1200 of FIG. 12, a dielectric material 1202 is formed over the encapsulation layer 1102. The dielectric material 1202 is formed to extend from within the plurality of cavities 1002 to over the first interconnect 106 and the second interconnect 108. In some embodiments, the dielectric material 1202 may be formed by a deposition process (e.g., an ALD process, a CVD process, a PE-CVD process, or the like). In some embodiments, the dielectric material 1202 may be formed to pinch off along an upper surface of the dielectric material 1202 so as to form one or more interior surfaces defining a cavity 704 between the first interconnect 106 and the second interconnect 108.

Figure 13:
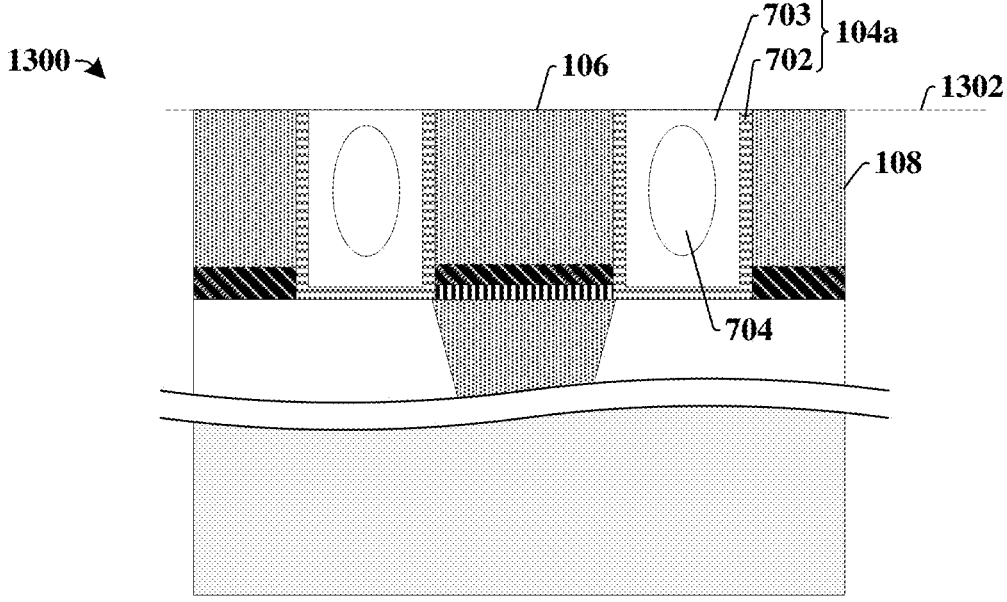

As shown in cross-sectional view 1300 of FIG. 13, a second planarization process is performed (along line 1302) to remove parts of the dielectric material 703 and to define a first ILD layer 104a between the first interconnect 106 and the second interconnect 108. In some embodiments, the second planarization process may further remove parts of the encapsulation layer 1102 and the first masking layer 1006 to expose upper surfaces of the first interconnect 106 and the second interconnect 108. In some embodiments, the second planarization process may comprise a chemical mechanical planarization (CMP) process.

Figure 14:
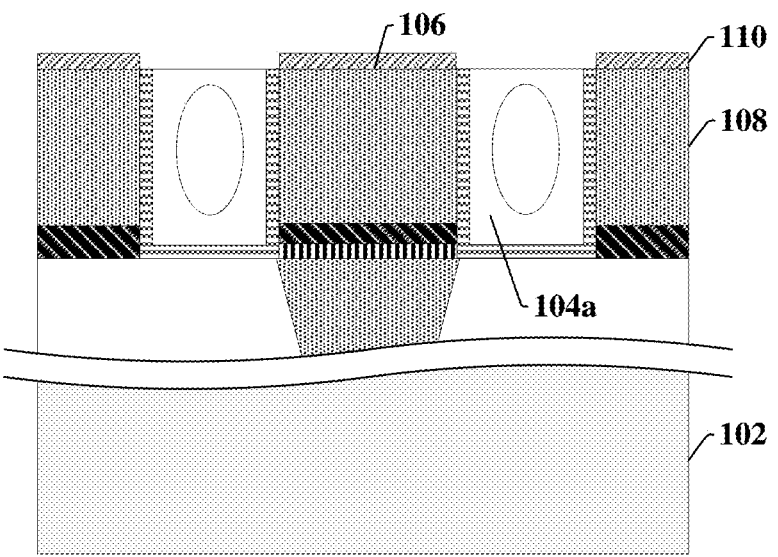

As shown in cross-sectional view 1400 of FIG. 14, an interconnect patterning layer 110 may be selectively formed onto the first interconnect 106 and the second interconnect 108. In some embodiments, the interconnect patterning layer 110 may be selectively formed onto the first interconnect 106 and the second interconnect 108 without being formed over the first ILD layer 104a. In some such embodiments, the interconnect patterning layer 110 is completely confined above the first interconnect 106 and the second interconnect 108. In some such embodiments, outer sidewalls of the interconnect patterning layer 110 may be separated from one another by a space overlying the first ILD layer 104a. In some such embodiments, the outer sidewalls of the interconnect patterning layer 110 may be substantially aligned with outer sidewalls of the first interconnect 106 and the second interconnect 108.

In some embodiments, the interconnect patterning layer 110 may comprise, be formed from, or be graphene, a self-assembled monolayer (e.g., comprising a thiol, a phosphonic acid, etc.), or the like. In some embodiments, the interconnect patterning layer 110 comprises a material that may prevent the subsequent formation of some types of etch stop layers on top of it.

For example, in some embodiments, the interconnect patterning layer 110 comprises a hydrophobic material. In some embodiments, the interconnect patterning layer 110 may be formed by way of a chemical vapor deposition (CVD) process. In some embodiments, the interconnect patterning layer 110 may be formed to a thickness that is less than approximately 5 nm.

Figure 15:
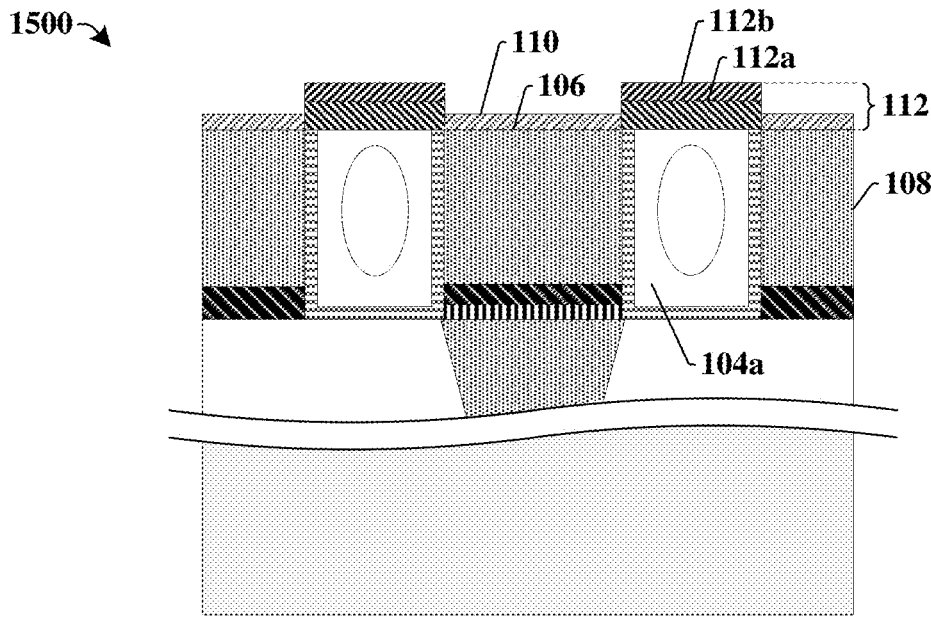

As shown in cross-sectional view 1500 of FIG. 15, a lower etch stop structure 112 is formed over the first ILD layer 104a and between the outer sidewalls of the interconnect patterning layer 110. In some embodiments, the lower etch stop structure 112 is selectively formed onto the first ILD layer 104a without being formed onto the interconnect patterning layer 110. In some embodiments, the lower etch stop structure 112 may have a greater thickness than the interconnect patterning layer 110. By having a greater thickness than the interconnect patterning layer 110, the lower etch stop structure 112 is able to better protect the first ILD layer 104a from damage due to subsequent etching processes.

In some embodiments, the lower etch stop structure 112 may comprise a first lower etch stop layer 112a and a second lower etch stop layer 112b over the first lower etch stop layer 112a. In some embodiments, the first lower etch stop layer 112a and the second lower etch stop layer 112b may comprise different materials. In some embodiments, the first lower etch stop layer 112a may be formed to a thickness of approximately 0.5 nm to approximately 5 nm. In some embodiments, the second lower etch stop layer 112b may be formed to a thickness of approximately 0.5 nm to approximately 10 nm. In various embodiments, the first lower etch stop layer 112a and/or the second lower etch stop layer 112b may be formed by way of a CVD process, an ALD process, a spin-on process, or the like. In some embodiments, the first lower etch stop layer 112a and the second lower etch stop layer 112b may be formed using precursors that are in liquid form. In such embodiments, a hydrophobic nature of the interconnect patterning layer 110 can prevent formation of the first lower etch stop layer 112a and the second lower etch stop layer 112b on the interconnect patterning layer 110.

In some embodiments, the first lower etch stop layer 112a may comprise a lower dielectric constant than the second lower etch stop layer 112b. Having the second lower etch stop layer 112b with a higher dielectric constant may increase a resistance to etching since it may allow the second lower etch stop layer 112b to have a higher density. Furthermore, having the first lower etch stop layer 112a with a lower dielectric constant than the second lower etch stop layer 112b reduces an RC delay of the interconnect structure since it increases a distance between the first interconnect 106 and a material having a higher dielectric constant. In various embodiments, the first lower etch stop layer 112a may comprise silicon, oxygen, carbon, or the like. In various embodiments, the second lower etch stop layer 112b may comprise aluminum, hafnium, yttrium, zirconium, hafnium, or the like As shown in cross-sectional views 1600-1602 of FIGS. 16A-16B, an upper etch stop structure 114 is formed onto the lower etch stop structure 112 and the interconnect patterning layer 110. A second ILD layer 104b is subsequently formed onto the upper etch stop structure 114. In various embodiments, the upper etch stop structure 114 may comprise one or more upper etch stop layers. For example, in some embodiments shown in cross-sectional view 1600 of FIG. 16A, the upper etch stop structure 114 may comprise a first upper etch stop layer 114a, a second upper etch stop layer 114b formed on the first upper etch stop layer 114a, and a third upper etch stop layer 114c formed on the second upper etch stop layer 114b. In other embodiments, shown in cross-sectional view 1602 of FIG. 16B, the upper etch stop structure 114 may be a first upper etch stop layer 114a that continuously extends between the lower etch stop structure 112 and the second ILD layer 104b. In various embodiments, the one or more etch stop layers of the upper etch stop structure 114 may comprise one or more of silicon, aluminum, yttrium, zirconium, hafnium, oxygen, carbon, nitrogen, or the like. In some embodiments, the one or more upper etch stop layers of the upper etch stop structure 114 may be formed by way of one or more deposition processes (e.g., an ALD process, a CVD process, a PE-CVD process, or the like).

Figures 17, 18A:
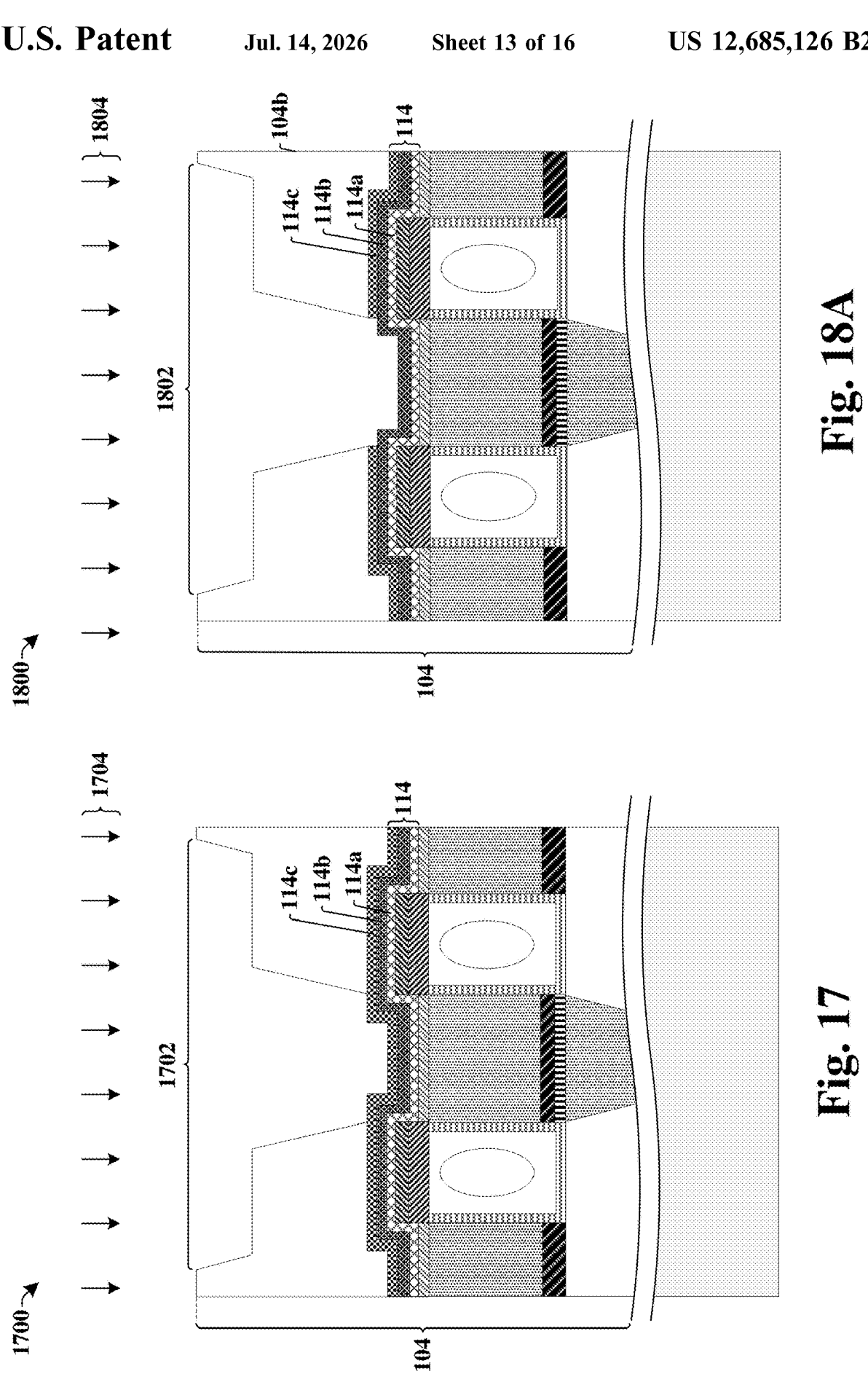

As shown in cross-sectional view 1700 of FIG. 17, a second etching process is performed to selectively pattern the second ILD layer 104b. The second etching process removes parts of the second ILD layer 104b to define a first intermediate interconnect opening 1702 defined by one or more interior surfaces of the second ILD layer 104b. In some embodiments, the first intermediate interconnect opening 1702 may comprise a via hole and/or a wire trench. The first intermediate interconnect opening 1702 exposes an upper surface of the upper etch stop structure 114. In some embodiments, the first intermediate interconnect opening 1702 may expose an upper surface of a third upper etch stop layer 114c. In some embodiments, the second etching process may be performed by selectively exposing the second ILD layer 104b to one or more etchants 1704 (e.g., a dry etchant, a wet etchant, or the like) according to one or more masking layers (e.g., a photosensitive material, photoresist, a hard mask, or the like). In some embodiments, the one or more etchants may comprise a dry etchant having a chlorine based etching chemistry, a fluorine based etching chemistry, and/or the like.

Figures 18B, 18C:
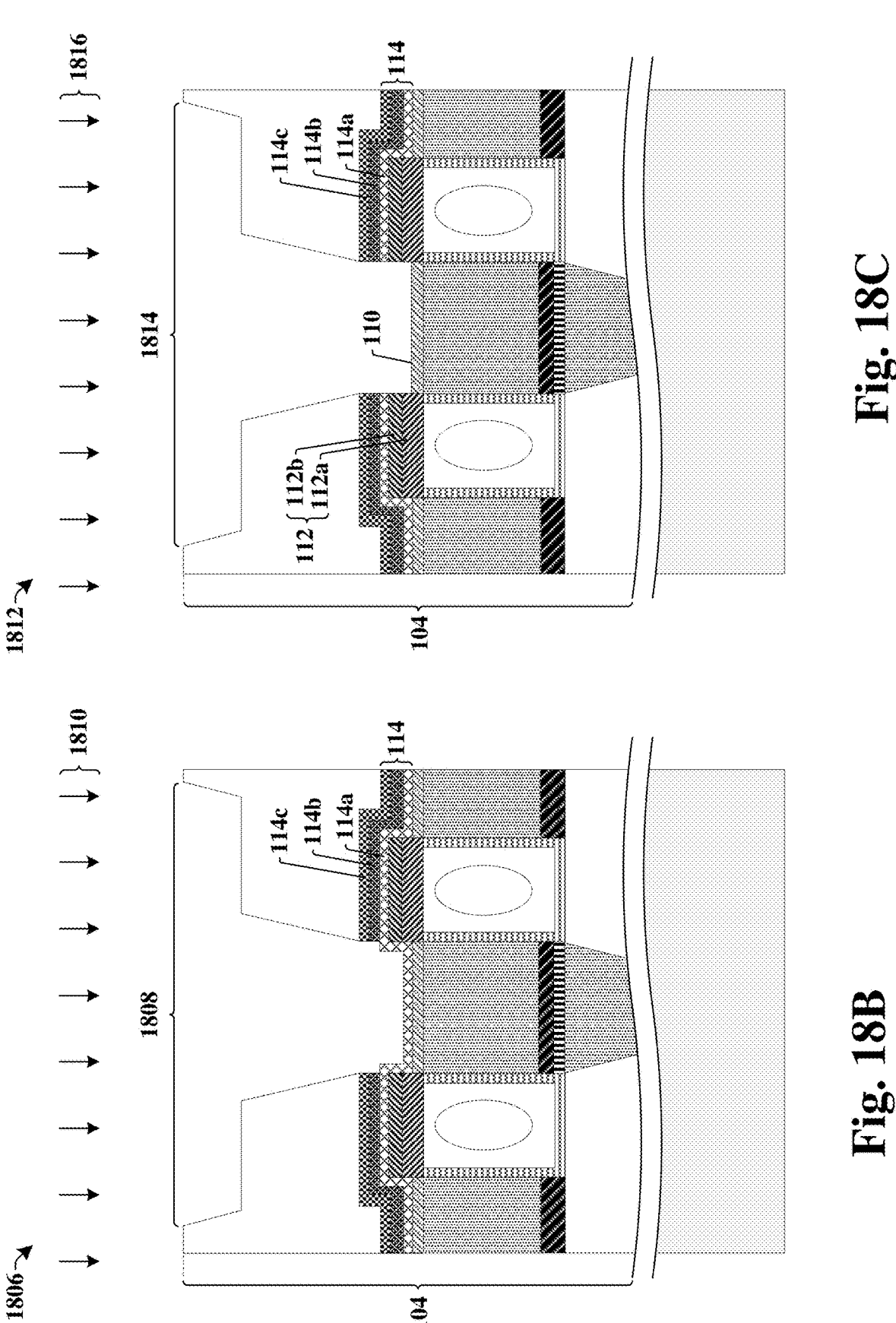

FIGS. 18A-18C illustrate some embodiments of etching processes used to etch through the upper etch stop structure 114. While FIGS. 18A-18C illustrate the etching of an upper etch stop structure 114 having three upper etch stop layers, it will be appreciated that in other embodiments, the upper etch stop structure 114 may have a different number of upper etch stop layers (e.g., one upper etch stop layer, two upper etch stop layers, four upper etch stop layers, etc.). In such embodiments, the number of etching processes may vary from that shown in FIGS. 18A-18C. For example, in some embodiments an upper etch stop structure 114 having a single upper etch stop layer may be removed by a single etching process, while an upper etch stop structure 114 having four upper etch stop layers may be removed by four etching processes.

As shown in cross-sectional view 1800 of FIG. 18A, a third etching process is performed to selectively remove exposed parts of the third upper etch stop layer 114c. Removal of the exposed parts of the third upper etch stop layer 114c exposes an upper surface of the second upper etch stop layer 114b and defines a first intermediate interconnect opening 1802. In some embodiments, the third etching process may expose parts of the third upper etch stop layer 114c to a third etchant 1804. In some embodiments, the third etchant 1804 may comprise a wet etchant, such as hydrofluoric acid, potassium hydroxide, a water based solution with amine, or the like. In some such embodiments (not shown), the third etchant 1804 may laterally etch the third upper etch stop layer 114c so that a lower surface of the second ILD layer 104b laterally extends past an upper surface of the third upper etch stop layer 114c.

As shown in cross-sectional view 1806 of FIG. 18B, a fourth etching process is performed to selectively remove exposed parts of the second upper etch stop layer 114b. Removal of the exposed parts of the second upper etch stop layer 114b exposes an upper surface of the first upper etch stop layer 114a and defines a second intermediate interconnect opening 1808. In some embodiments, the fourth etching process may expose parts of the second upper etch stop layer 114b to a fourth etchant 1810. In some embodiments, the fourth etchant 1810 may comprise a dry etchant. In some embodiments, the fourth etchant 1810 may comprise a chlorine based etching chemistry, a fluorine based etching chemistry, and/or the like. In some such embodiments (not shown), the second upper etch stop layer 114b may have an upper surface that laterally extends past a lower surface of the third upper etch stop layer 114c.

As shown in cross-sectional view 1812 of FIG. 18C, a fifth etching process is performed to selectively remove exposed parts of the first upper etch stop layer 114a. Removal of the exposed parts of the first upper etch stop layer 114a exposes an upper surface of the interconnect patterning layer 110 and defines a third intermediate interconnect opening 1814. In some embodiments, the fifth etching process may expose parts of the first upper etch stop layer 114a to a fifth etchant 1816. In some embodiments, the fifth etchant 1816 may comprise a wet etchant, such as hydrofluoric acid, potassium hydroxide, a water based solution with amine, or the like. In some such embodiments (not shown), the fifth etchant 1816 may laterally etch the first upper etch stop layer 114a so that a lower surface of the second upper etch stop layer 114b laterally extends past an upper surface of the first upper etch stop layer 114a.

Figures 19, 20:
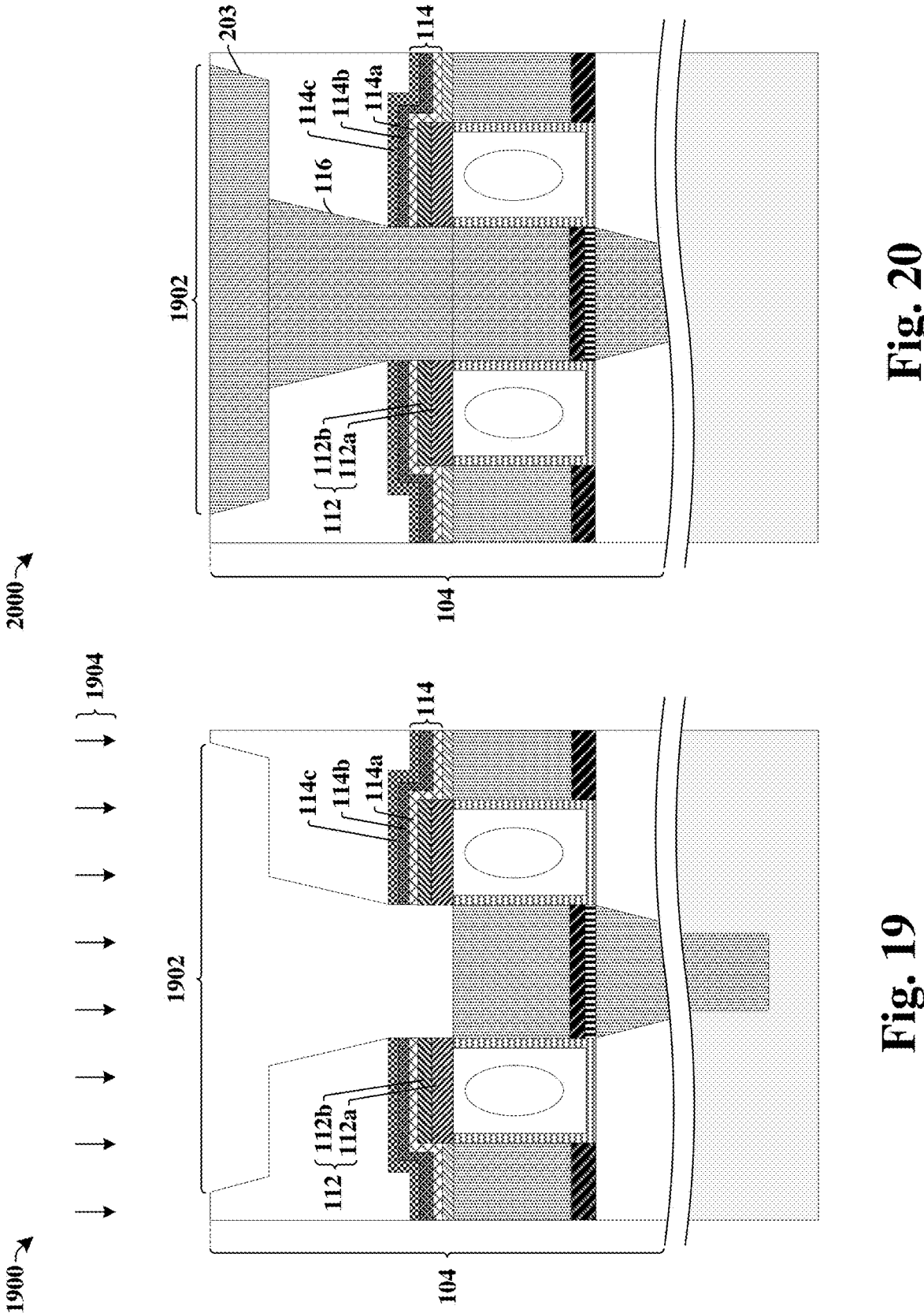

As shown in cross-sectional view 1900 of FIG. 19, a part of the interconnect patterning layer 110 is removed by a sixth etching process. Removal of the interconnect patterning layer 110 by the sixth etching process defines an interconnect opening 1902. The sixth etching process has a high etching selectivity between the interconnect patterning layer 110 and the lower etch stop structure 112 and/or the upper etch stop structure 114. In some embodiments, the sixth etching process may utilize a sixth etchant 1904 that comprises a dry etchant including oxygen. For example, in some embodiments the sixth etchant 1904 may comprise a dry etchant including carbon dioxide ($CO_2$), oxygen ($O_2$), water ($H_2O$), or the like.

The high etching selectivity allows for the interconnect patterning layer 110 to be removed at a higher rate (i.e., faster) than the lower etch stop structure 112 and/or the upper etch stop structure 114. In some embodiments, the interconnect patterning layer 110 may be removed at an etch rate that is approximately 10 times or more than that of the lower etch stop structure 112 and/or the upper etch stop structure 114. By removing the interconnect patterning layer 110 at a higher rate than the lower etch stop structure 112 and/or the upper etch stop structure 114, misalignment errors can be mitigated. This is because the lower etch stop structure 112 and/or the upper etch stop structure 114 will prevent a misaligned interconnect opening from damaging the first ILD layer 104a.

As shown in cross-sectional view 2000 of FIG. 20, a second conductive material is formed within the interconnect opening 1902. In some embodiments, the second conductive material may be formed by way of a deposition process and/or a plating process (e.g., electroplating, electroless plating, etc.). In various embodiments, the second conductive material may comprise copper, aluminum, or the like. A third planarization process may be performed after forming the second conductive material within the interconnect opening 1902. The third planarization process removes excess of the second conductive material from over the second ILD layer 104b to define a third interconnect 116 and a fourth interconnect 203 over the third interconnect 116. In some embodiments, the third interconnect 116 is an interconnect via and the fourth interconnect 203 is an interconnect wire. In some embodiments, the third planarization process may comprise a CMP process.

FIG. 21 illustrates a flow diagram of some embodiments of a method 2100 of forming an integrated chip having an interconnect structure comprising an interconnect patterning layer.

While the disclosed method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a lower interconnect is formed within a lower inter-level dielectric (ILD) layer over a substrate. FIG. 8 illustrates a cross-sectional view 800 of some embodiments corresponding to act 2102.

At act 2104, a conductive layer is formed over the lower interconnect and the lower ILD layer. FIG. 9 illustrates a cross-sectional view 900 of some embodiments corresponding to act 2104.

At act 2106, the conductive layer is patterned to define a first interconnect and a second interconnect. FIG. 10 illustrates a cross-sectional view 1000 of some embodiments corresponding to act 2106.

At act 2108, a dielectric material is formed between the first interconnect and the second interconnect. FIGS. 11-12 illustrate cross-sectional views, 1100 and 11200, of some embodiments corresponding to act 2108.

At act 2110, a planarization process is performed to remove a part of the dielectric material and to define a first ILD layer between the first interconnect and the second interconnect. FIG. 13 illustrates a cross-sectional view 1300 of some embodiments corresponding to act 2110.

At act 2112, an interconnect patterning layer is formed on the first interconnect and the second interconnect. FIG. 14 illustrates a cross-sectional view 1400 of some embodiments corresponding to act 2112.

At act 2114, a lower etch stop structure is formed over the first ILD layer and between sidewalls of the interconnect patterning layer. FIG. 15 illustrates a cross-sectional view 1500 of some embodiments corresponding to act 2114.

Figures 16A, 16B:
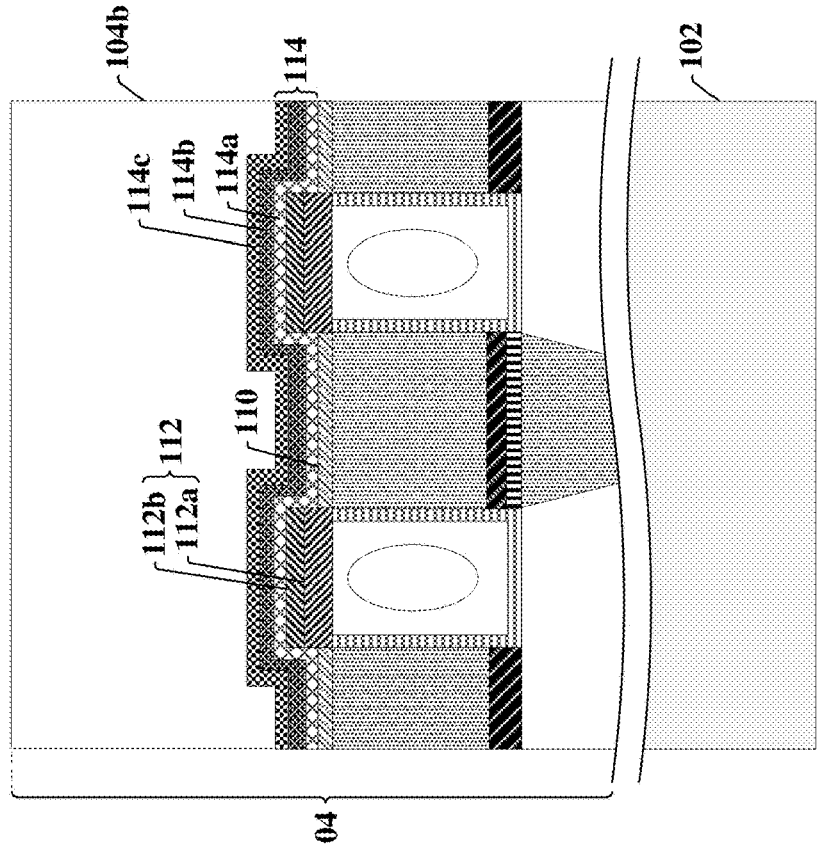

At act 2116, an upper etch stop structure is formed to continuously extend over the lower etch stop structure and the interconnect patterning layer. FIGS. 16A and 16B illustrate cross-sectional views, 1600 and 1602, of some embodiments corresponding to act 2116.

At act 2118, a second ILD layer is formed on the upper etch stop structure. FIGS. 16A and 16B illustrate cross-sectional views, 1600 and 1602, of some embodiments corresponding to act 2118.

At act 2120, an intermediate interconnect opening is formed within the second ILD layer to expose the interconnect patterning layer. FIGS. 17-18C illustrate cross-sectional views 1700, 1800, 1806, and 1812, of some embodiments corresponding to act 2120.

At act 2122, part of the interconnect patterning layer is removed to form an interconnect opening exposing the first interconnect. FIG. 19 illustrates a cross-sectional view 1900 of some embodiments corresponding to act 2122.

At act 2124, a conductive material is formed within the interconnect opening. FIG. 20 illustrates a cross-sectional view 2000 of some embodiments corresponding to act 2124.

Accordingly, in some embodiments, the present disclosure relates to an integrated chip having a back-end-of-the-line (BEOL) interconnect structure having an interconnect patterning layer that is configured to reduce ILD damage due to misalignment errors.

In some embodiments, the present disclosure relates to an integrated chip. The integrated chip includes a first interconnect and a second interconnect disposed within a first inter-level dielectric (ILD) layer over a substrate; a lower etch stop structure disposed on the first ILD layer; a third interconnect disposed within a second ILD layer that is over the first ILD layer, the third interconnect extending through the lower etch stop structure to contact the first interconnect; and an interconnect patterning layer disposed on the second interconnect and laterally adjacent to the lower etch stop structure.

In other embodiments, the present disclosure relates to an integrated chip. The integrated chip includes a first interconnect disposed within a first inter-level dielectric (ILD) layer over a substrate; a lower etch stop structure disposed on the first ILD layer; and a second interconnect disposed within a second ILD layer that is over the first ILD layer, the second interconnect including a first lower surface that is directly over the first interconnect and a second lower surface that is directly over the lower etch stop structure and laterally outside of the first interconnect.

In other embodiments, the present disclosure relates to a method of forming an integrated chip. The method includes forming a first interconnect over a substrate, the first interconnect surrounded by a first ILD layer; forming an interconnect patterning layer on the first interconnect; forming a lower etch stop structure on the first ILD layer and along a sidewall of the interconnect patterning layer; forming a second ILD layer over the lower etch stop structure and the interconnect patterning layer; performing one or more etching processes to form an intermediate interconnect opening exposing an upper surface of the interconnect patterning layer; performing an etching process to remove the interconnect patterning layer and to form an interconnect opening exposing an upper surface of the first interconnect; and forming a conductive material within the interconnect opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:

a first interconnect and a second interconnect disposed within a first inter-level dielectric (ILD) layer over a substrate;

a lower etch stop structure disposed on the first ILD layer;

a third interconnect disposed within a second ILD layer that is over the first ILD layer, wherein the third interconnect extends through the lower etch stop structure to contact the first interconnect;

an interconnect patterning layer disposed on the first interconnect and laterally between the third interconnect and the lower etch stop structure; and an upper etch stop structure continuously extending over upper surfaces of the lower etch stop structure and the interconnect patterning layer, wherein the second ILD layer is on the upper etch stop structure.

2. The integrated chip of claim 1, wherein the interconnect patterning layer comprises graphene.

3. The integrated chip of claim 1, wherein an outer sidewall of the interconnect patterning layer contacts an outer sidewall of the lower etch stop structure.

4. The integrated chip of claim 1, wherein the interconnect patterning layer has a smaller thickness than the lower etch stop structure.

5. The integrated chip of claim 1, wherein the lower etch stop structure comprises:

a first lower etch stop layer having a first dielectric constant; and a second lower etch stop layer over the first lower etch stop layer, wherein the second lower etch stop layer has a second dielectric constant that is greater than the first dielectric constant.

6. The integrated chip of claim 1, wherein the upper etch stop structure comprises a plurality of stacked etch stop layers comprising two or more different materials.

7. The integrated chip of claim 1, wherein the third interconnect comprises a first segment that is directly between sidewalls of the lower etch stop structure and that has a lower sidewall angled at a first slope; and wherein the third interconnect comprises a second segment that is over the lower etch stop structure and that has an upper sidewall angled at a second slope that is smaller than the first slope.

8. The integrated chip of claim 1, wherein the interconnect patterning layer comprises a continuous segment that is completely confined above the second interconnect and the lower etch stop structure is completely confined above the first ILD layer.

9. The integrated chip of claim 1, wherein an outer sidewall of the interconnect patterning layer is substantially aligned with an outer sidewall of the second interconnect.

10. The integrated chip of claim 1, wherein the first interconnect continuously extends for non-zero distances below the third interconnect and the interconnect patterning layer.

11. The integrated chip of claim 1, wherein an entirety of the interconnect patterning layer is laterally outside of the lower etch stop structure.

12. The integrated chip of claim 1, wherein the interconnect patterning layer has a topmost surface that is vertically below a topmost surface of the lower etch stop structure.

13. An integrated chip, comprising:

a first interconnect disposed within a first inter-level dielectric (ILD) layer over a substrate;

a lower etch stop structure disposed on the first ILD layer;

a second interconnect disposed within a second ILD layer that is over the first ILD layer, wherein the second interconnect comprises a first lower surface that is directly over the first interconnect and a second lower surface that is directly over the lower etch stop structure and laterally outside of the first interconnect;

an upper etch stop structure on the lower etch stop structure, wherein the upper etch stop structure extends from a first lower surface of the upper etch stop structure that is over the lower etch stop structure to a second lower surface of the upper etch stop structure that is vertically between a top and a bottom of the lower etch stop structure;

an interconnect patterning layer disposed vertically between an upper surface of the first interconnect and the second lower surface of the upper etch stop structure and laterally between a sidewall of the second interconnect and a sidewall of the lower etch stop structure; and wherein the sidewall of the second interconnect faces the lower etch stop structure and is laterally spaced from the lower etch stop structure by a non-zero distance.

14. The integrated chip of claim 13, wherein the second interconnect comprises a protrusion extending outward from a second sidewall of the second interconnect to directly below the second lower surface of the upper etch stop structure.

15. The integrated chip of claim 13, wherein the second interconnect is laterally separated from the lower etch stop structure by a gap that is below the second lower surface of the upper etch stop structure.

16. The integrated chip of claim 13, wherein the sidewall of the second interconnect is directly over the first interconnect and a second sidewall of the second interconnect is directly over the lower etch stop structure.

17. The integrated chip of claim 13, wherein the second interconnect is asymmetric with respect to a line bisecting the second interconnect.

18. An integrated chip, comprising:

a plurality of lower interconnects disposed within a first inter-level dielectric (ILD) layer over a substrate, as viewed in a cross-sectional view;

an interconnect patterning layer disposed on an upper surface of a first interconnect of the plurality of lower interconnects;

a lower etch stop structure over an upper surface of the first ILD layer;

an upper etch stop structure disposed directly over both the lower etch stop structure and the interconnect patterning layer, wherein the upper etch stop structure physically contacts upper surfaces of both the lower etch stop structure and the interconnect patterning layer; and an upper interconnect arranged within a second ILD layer disposed on the upper etch stop structure, the upper interconnect extending through the second ILD layer and the upper etch stop structure to contact a second interconnect of the plurality of lower interconnects.

19. The integrated chip of claim 18, wherein the interconnect patterning layer completely covers the upper surface of the first interconnect, as viewed in the cross-sectional view.

20. The integrated chip of claim 18, wherein the first ILD layer is a low-k dielectric material.

\* \* \* \* \*